US010181428B2

(12) United States Patent
Mason et al.

(10) Patent No.: US 10,181,428 B2
(45) Date of Patent: Jan. 15, 2019

(54) SILICON ON POROUS SILICON

(71) Applicant: SKYWORKS SOLUTIONS, INC., Woburn, MA (US)

(72) Inventors: Jerod F. Mason, Bedford, MA (US); David Scott Whitefield, Andover, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 153 days.

(21) Appl. No.: 15/247,725

(22) Filed: Aug. 25, 2016

(65) Prior Publication Data
US 2017/0062284 A1 Mar. 2, 2017

Related U.S. Application Data

(60) Provisional application No. 62/211,575, filed on Aug. 28, 2015.

(51) Int. Cl.
| | |
|---|---|
| *H01L 21/762* | (2006.01) |
| *H01L 27/13* | (2006.01) |
| *H01L 21/84* | (2006.01) |
| *H01L 21/3105* | (2006.01) |
| *H01L 21/02* | (2006.01) |
| *H01L 21/76* | (2006.01) |
| *H01L 21/3063* | (2006.01) |
| *H01L 29/78* | (2006.01) |
| *H01L 21/768* | (2006.01) |
| *H01L 23/528* | (2006.01) |

(52) U.S. Cl.
CPC ........ *H01L 21/84* (2013.01); *H01L 21/02164* (2013.01); *H01L 21/3063* (2013.01); *H01L 21/31055* (2013.01); *H01L 21/76* (2013.01); *H01L 21/7685* (2013.01); *H01L 21/76877* (2013.01); *H01L 23/5283* (2013.01); *H01L 29/78* (2013.01)

(58) Field of Classification Search
CPC ................. H01L 27/1203; H01L 21/84; H01L 21/76251; H01L 21/764; H01L 29/78; H01L 29/0649; H01L 23/562; H01L 21/76877; H01L 21/30604; H01L 29/786; H01L 29/66772; H01L 23/535; H01L 21/76898; H01L 21/76895; H01L 21/76802; H01L 21/31055; H01L 21/02164; H01L 21/76; H01L 21/3063
See application file for complete search history.

(56) References Cited

U.S. PATENT DOCUMENTS

| | | | | |
|---|---|---|---|---|
| 9,564,405 | B2 * | 2/2017 | Mason | H04B 1/401 |
| 9,806,094 | B2 * | 10/2017 | Whitefield | H01L 27/1203 |
| 9,831,192 | B2 * | 11/2017 | Petzold | H01L 27/1203 |
| 9,859,225 | B2 * | 1/2018 | Petzold | H01L 23/562 |
| 2004/0245571 | A1 * | 12/2004 | Cheng | H01L 21/02378 |
| | | | | 257/347 |
| 2014/0124897 | A1 * | 5/2014 | Motoyama | H01L 23/66 |
| | | | | 257/617 |
| 2017/0033135 | A1 * | 2/2017 | Whitefield | H01L 21/6835 |
| 2017/0331501 | A1 * | 11/2017 | Kononchuk | H04B 1/03 |

* cited by examiner

*Primary Examiner* — Savitr Mulpuri
(74) *Attorney, Agent, or Firm* — Chang & Hale LLP

(57) ABSTRACT

Fabricating of radio-frequency (RF) devices involves providing a field-effect transistor formed over an oxide layer formed on a semiconductor substrate and converting at least a portion of the semiconductor substrate to porous silicon.

13 Claims, 18 Drawing Sheets

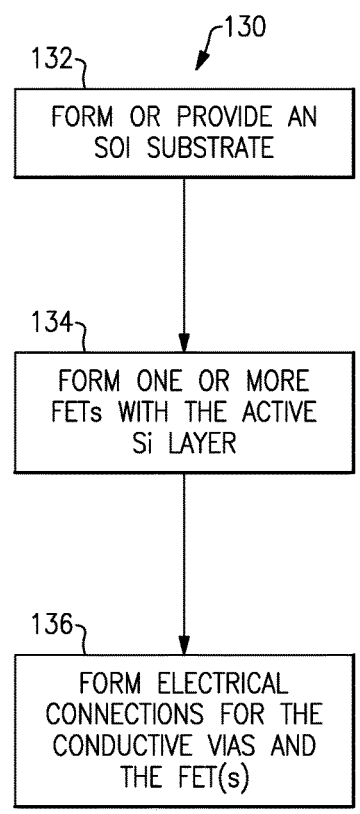
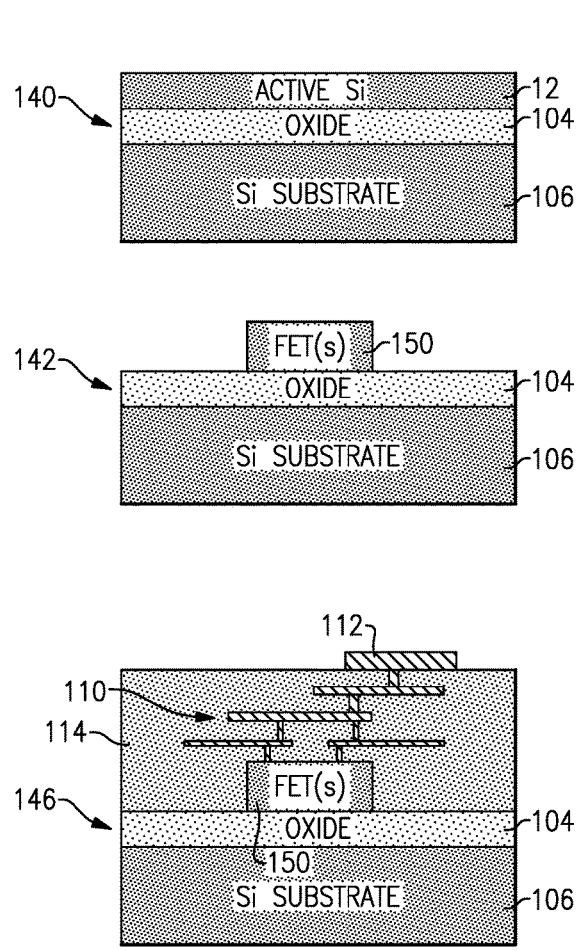
FIG.11
FIG.12

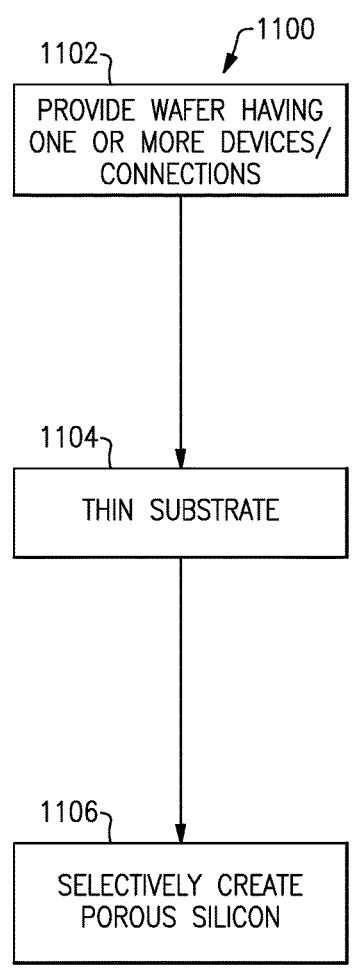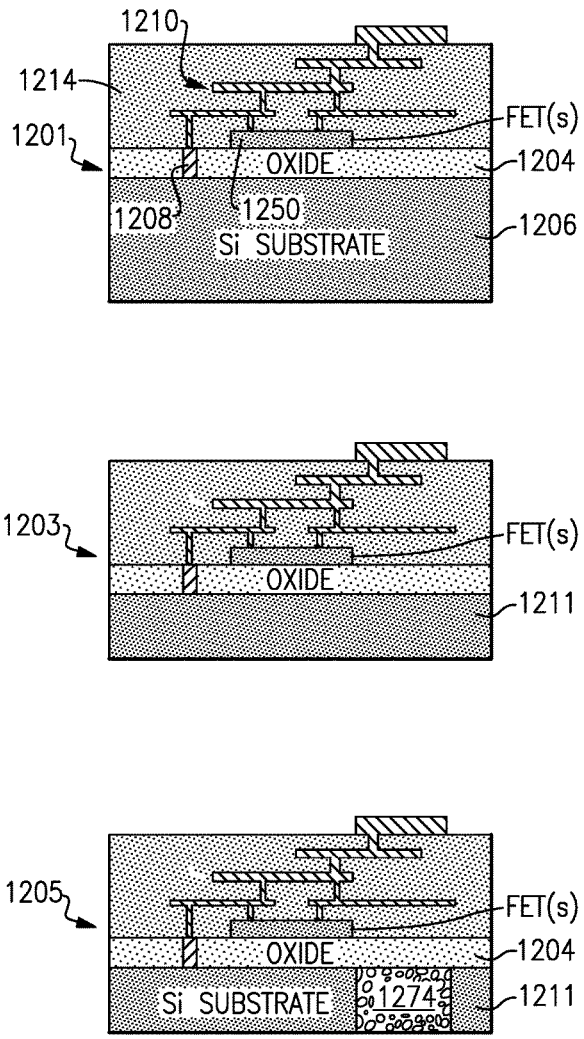
FIG. 17
FIG. 18

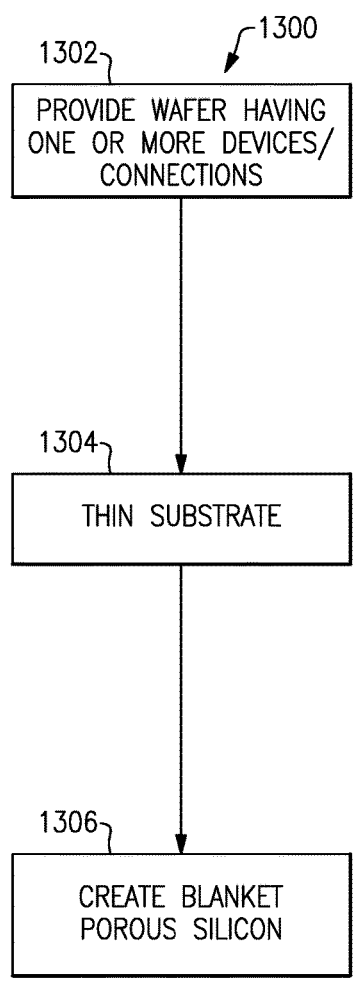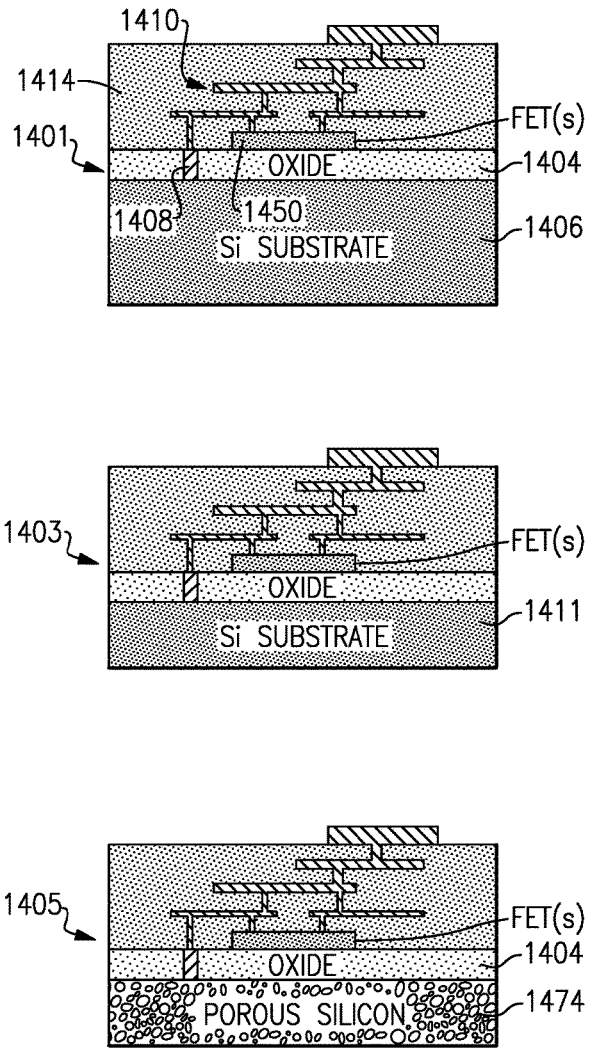
FIG. 19
FIG. 20

SILICON ON POROUS SILICON

CROSS-REFERENCE TO RELATED APPLICATION(S)

This application claims priority to U.S. Provisional Application No. 62/211,575, filed Aug. 28, 2015, and entitled SILICON ON POROUS SILICON, the disclosure of which is hereby incorporated by reference in its entirety.

BACKGROUND

Field

The present disclosure relates to field-effect transistor (FET) devices such as silicon-on-insulator (SOI) devices.

Description of the Related Art

In electronics applications, active electronic devices can be fabricated using semiconductor materials. Active electronic devices can be used for processing radio-frequency (RF) signals in wireless devices.

SUMMARY

In accordance with some implementations, the present disclosure relates to a method for fabricating a radio-frequency device. The method may comprise providing a field-effect transistor formed over an oxide layer formed on a semiconductor substrate and converting at least a portion of the semiconductor substrate to porous silicon.

In certain embodiments, the at least a portion of the semiconductor substrate is positioned at least partially beneath a passive device of the radio-frequency device. For example, the at least a portion of the substrate may not laterally overlap with the field-effect transistor. In certain embodiments, the radio-frequency device includes a passive portion and an active portion, the porous silicon being positioned at least partially underneath the passive portion. The at least a portion of the semiconductor substrate may include substantially all of the semiconductor substrate. The porous silicon may at least partially isolate the field-effect transistor from one or more other active devices of the radio-frequency device. In certain embodiments, the radio-frequency device is a silicon-on-insulator device.

The method may further comprise thinning a backside of the semiconductor substrate prior to said converting. The method may further comprise patterning the backside of the semiconductor substrate to form an opening, said converting the at least a portion of the semiconductor substrate to porous silicon being performed through the opening. In certain embodiments, converting the at least a portion of the semiconductor substrate to porous silicon may be performed using electrochemical etching.

In some implementations, the present disclosure relates to a method for fabricating a radio-frequency device. The method may comprise providing a substrate structure including a silicon handle wafer, an oxide layer formed on the silicon handle wafer, and an active silicon layer disposed on the oxide layer, removing at least a portion of the oxide layer to at least partially expose a top surface of the silicon handle waver, converting at least a portion of the silicon handle wafer to porous silicon, and forming a radio-frequency element over the substrate structure.

The method may further comprise forming a second radio-frequency element over the substrate structure, the porous silicon being disposed at least partially laterally between the first and second radio-frequency elements. In certain embodiments, the porous silicon is disposed at least partially under a passive device formed over the substrate structure. The radio-frequency element may be an active device, the porous silicon being disposed at least partially under the radio-frequency element.

The method may further comprise forming a layer of planarizing material on the porous silicon. For example, the planarizing material may be silicon oxide. The method may further comprise performing chemical-mechanical planarization on the layer of planarizing material. In certain embodiments, converting the at least a portion of the silicon handle wafer to porous silicon is performed using electrochemical etching.

In some implementations, the present disclosure relates to a method for fabricating a radio-frequency device. The method may comprise providing a substrate structure including a silicon handle wafer, a porous silicon layer formed on the silicon handle wafer, an oxide layer formed on the silicon handle wafer, and an active silicon layer disposed on the oxide layer, and forming a radio-frequency element above the porous silicon layer. The substrate structure may further include a trap-rich layer between the porous silicon layer and the oxide layer.

In some implementations, the present disclosure relates to a radio-frequency device comprising a field-effect transistor implemented over an oxide layer, a semiconductor substrate layer on which the oxide layer is formed, the semiconductor substrate including a porous silicon portion, and one or more electrical connections connected to the field-effect transistor.

The porous silicon portion may be positioned at least partially beneath a passive device of the radio-frequency device. The porous silicon portion may not laterally overlap with the field-effect transistor. In certain embodiments, the radio-frequency device includes a passive portion and an active portion, the porous silicon portion being positioned at least partially underneath the passive portion. In certain embodiments, the porous silicon portion includes substantially all of the semiconductor substrate layer.

In certain embodiments, the porous silicon portion at least partially isolates the field-effect transistor from one or more other active devices of the radio-frequency device. The radio-frequency device may be a silicon-on-insulator (SOI) device. The semiconductor substrate layer may be a thinned substrate layer.

In some implementations, the present disclosure relates to a radio-frequency module comprising a packaging substrate configured to receive a plurality of devices and a switching device mounted on the packaging substrate, the switching device including a field-effect transistor implemented over an oxide layer and a semiconductor substrate layer on which the oxide layer is formed, the semiconductor substrate including a porous silicon portion, the switching device further including one or more electrical connections connected to the field-effect transistor.

In some implementations, the present disclosure relates to a wireless device comprising a transceiver configured to process radio-frequency signals, a radio-frequency module in communication with the transceiver, the radio-frequency module including a switching device mounted on the packaging substrate, the switching device including a field-effect transistor implemented over an oxide layer and a semiconductor substrate layer on which the oxide layer is formed, the semiconductor substrate including a porous silicon portion, the switching device further including one or more electrical connections connected to the field-effect transistor, and an antenna in communication with the radio-frequency module, the antenna configured to facilitate transmitting and/or receiving of the radio-frequency signals.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

FIG. 11 shows a process that can be implemented to facilitate fabrication of an SOI FET device having one or more features as described herein.

FIG. 12 shows examples of various stages of the fabrication process of FIG. 11.

FIG. 16 shows an example biasing configuration implemented in a switch arm having a stack of.

FIG. 17 shows a process that can be implemented to form one or more porous silicon portions or regions in a silicon or SOI device or structure having one or more features as described herein.

FIG. 18 shows examples of various stages of the fabrication processes of FIG. 17.

FIG. 19 shows a process that can be implemented to form a layer of porous silicon as a backside substrate for a silicon or SOI device or structure having one or more features as described herein.

FIG. 20 shows examples of various stages of the fabrication processes of FIG. 19.

DESCRIPTION

The headings provided herein, if any, are for convenience only and do not necessarily affect the scope or meaning of the claimed invention.

Introduction

Disclosed herein are various examples of a field-effect transistor (FET) device having one or more regions relative to an active FET portion configured to provide a desired operating condition for the active FET. In such various examples, terms such as FET device, active FET portion, and FET are sometimes used interchangeably, with each other, or some combination thereof. Accordingly, such interchangeable usage of terms should be understood in appropriate contexts.

Figure 1:
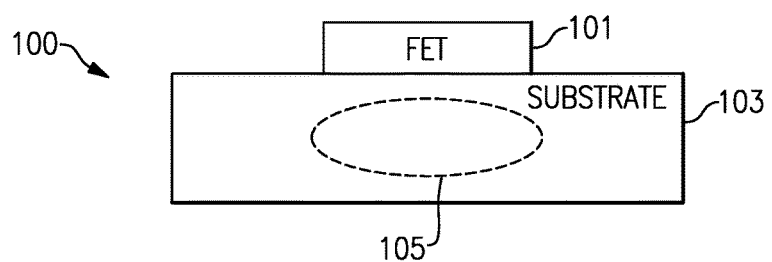
FIG. 1 shows an example of a field-effect transistor (FET) device having an active FET implemented on a substrate, and a region below the active FET configured to include one or more features to provide one or more desirable operating functionalities for the active FET.

FIG. 1 shows an example of a FET device 100 having an active FET 101 implemented on a substrate 103. As described herein, such a substrate can include one or more layers configured to facilitate, for example, operating functionality of the active FET, processing functionality for fabrication and support of the active FET, etc. For example, if the FET device 100 is implemented as a silicon-on-Insulator (SOI) device, the substrate 103 can include an insulator layer such as a buried oxide (BOX) layer, an interface layer, and a handle wafer layer.

FIG. 1 further shows that in some embodiments, a region 105 below the active FET 101 can be configured to include one or more features to provide one or more desirable operating functionalities for the active FET 101. For the purpose of description, it will be understood that relative positions above and below are in the example context of the active FET 101 being oriented above the substrate 103 as shown. Accordingly, some or all of the region 105 can be implemented within the substrate 103. Further, it will be understood that the region 105 may or may not overlap with the active FET 101 when viewed from above (e.g., in a plan view).

Figure 2:
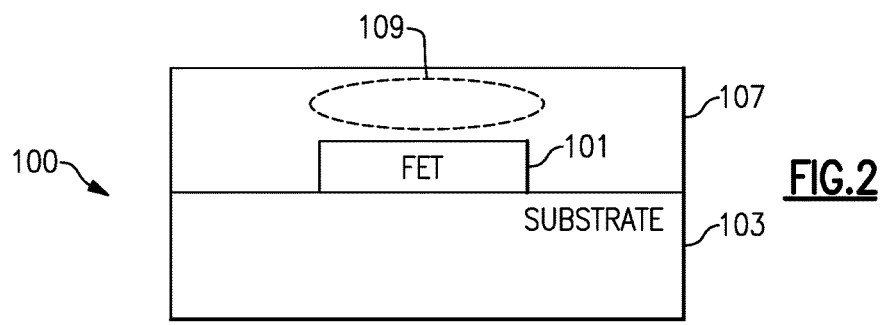
FIG. 2 shows an example of a FET device having an active FET implemented on a substrate, and a region above the active FET configured to include one or more features to provide one or more desirable operating functionalities for the active FET.

FIG. 2 shows an example of a FET device 100 having an active FET 101 implemented on a substrate 103. As described herein, such a substrate can include one or more layers configured to facilitate, for example, operating functionality of the active FET 100, processing functionality for fabrication and support of the active FET 100, etc. For example, if the FET device 100 is implemented as a silicon-on-Insulator (SOI) device, the substrate 103 can include an insulator layer such as a buried oxide (BOX) layer, an interface layer, and a handle wafer layer.

In the example of FIG. 2, the FET device 100 is shown to further include an upper layer 107 implemented over the substrate 103. In some embodiments, such an upper layer can include, for example, a plurality of layers of metal routing features and dielectric layers to facilitate, for example, connectivity functionality for the active FET 100.

FIG. 2 further shows that in some embodiments, a region 109 above the active FET 101 can be configured to include one or more features to provide one or more desirable operating functionalities for the active FET 101. Accordingly, some or all of the region 109 can be implemented within the upper layer 107. Further, it will be understood that the region 109 may or may not overlap with the active FET 101 when viewed from above (e.g., in a plan view).

Figure 3:
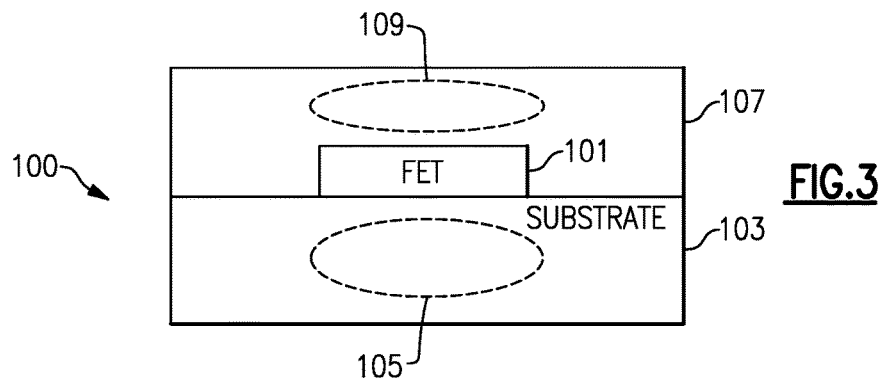
FIG. 3 shows that in some embodiments, a FET device can include both of the regions of FIGS. 1 and 2 relative to an active FET.

FIG. 3 shows an example of a FET device 100 having an active FET 101 implemented on a substrate 103, and also having an upper layer 107. In some embodiments, the substrate 103 can include a region 105 similar to the example of FIG. 1, and the upper layer 107 can include a region 109 similar to the example of FIG. 2.

Examples related to some or all of the configurations of FIGS. 1-3 are described herein in greater detail.

Figure 4:
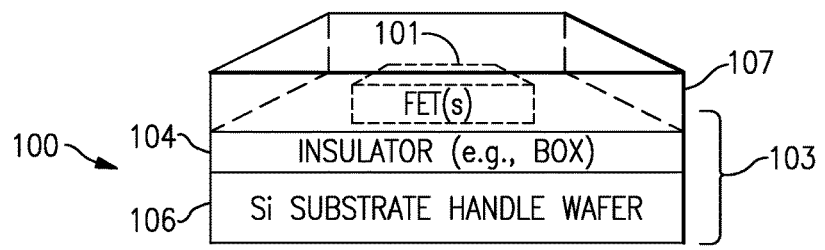
FIG. 4 shows an example FET device implemented as an individual silicon-on-insulator (SOI) unit.
Figure 5:
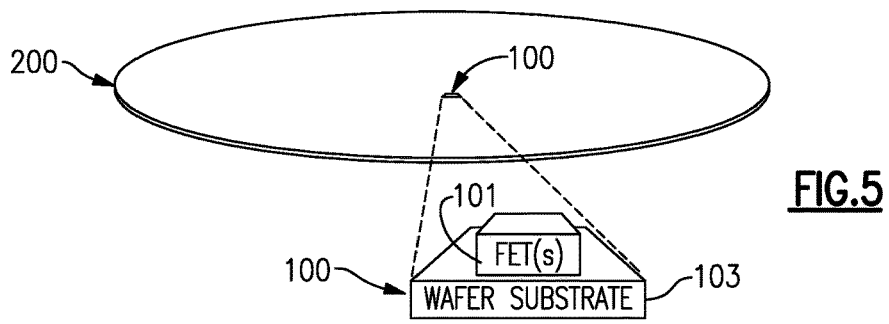
FIG. 5 shows that in some embodiments, a plurality of individual SOI devices similar to the example SOI device of FIG. 4 can be implemented on a wafer.

In the examples of FIGS. 1-3, the FET devices 100 are depicted as being individual units (e.g., as semiconductor die). FIGS. 4-6 show that in some embodiments, a plurality of FET devices having one or more features as described herein can be fabricated partially or fully in a wafer format, and then be singulated to provide such individual units.

For example, FIG. 4 shows an example FET device 100 implemented as an individual SOI unit. Such an individual SOI device can include one or more active FETs 101 implemented over an insulator such as a BOX layer 104 which is itself implemented over a handle layer such as a silicon (Si) substrate handle wafer 106. In the example of FIG. 4, the BOX layer 104 and the Si substrate handle wafer 106 can collectively form the substrate 103 of the examples of FIGS. 1-3, with or without the corresponding region 105.

In the example of FIG. 4, the individual SOI device 100 is shown to further include an upper layer 107. In some embodiments, such an upper layer can be the upper layer 103 of FIGS. 2 and 3, with or without the corresponding region 109.

FIG. 5 shows that in some embodiments, a plurality of individual SOI devices similar to the example SOI device 100 of FIG. 4 can be implemented on a wafer 200. As shown, such a wafer can include a wafer substrate 103 that includes a BOX layer 104 and a Si handle wafer layer 106 as described in reference to FIG. 4. As described herein, one or more active FETs can be implemented over such a wafer substrate.

In the example of FIG. 5, the SOI device 100 is shown without the upper layer (107 in FIG. 4). It will be understood that such a layer can be formed over the wafer substrate 103, be part of a second wafer, or any combination thereof.

Figure 6A:
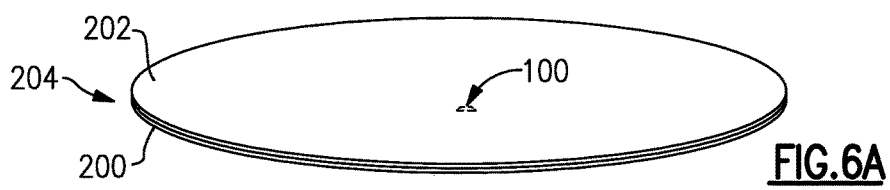
FIG. 6A shows an example wafer assembly having a first wafer and a second wafer positioned over the first wafer.
Figure 6B:
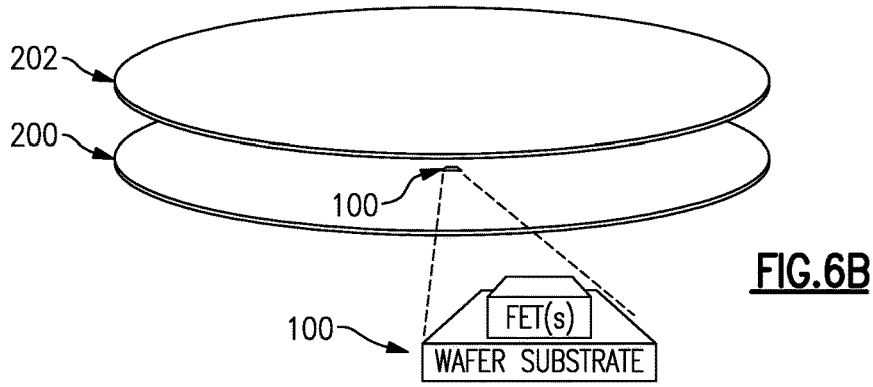
FIG. 6B shows an unassembled view of the first and second wafers of the example of FIG. 6A.

FIG. 6A shows an example wafer assembly 204 having a first wafer 200 and a second wafer 202 positioned over the first wafer 200. FIG. 6B shows an unassembled view of the first and second wafers 200, 202 of the example of FIG. 6A.

In some embodiments, the first wafer 200 can be similar to the wafer 200 of FIG. 5. Accordingly, the first wafer 200 can include a plurality of SOI devices 100 such as the example of FIG. 4. In some embodiments, the second wafer 202 can be configured to provide, for example, a region (e.g., 109 in FIGS. 2 and 3) over a FET of each SOI device 100, and/or to provide temporary or permanent handling wafer functionality for process steps involving the first wafer 200.

Examples of SOI Implementation of FET Devices

Certain embodiments disclosed herein provide for performance and/or size improvement in transistor stacks using non-uniform drain-to-source spacing and/or other dimensional modifications. Principles and concepts disclosed herein may advantageously be implemented in connection with Silicon-on-Insulator (SOI) processes. Although certain embodiments are disclosed herein in the context of SOI technologies, it should be understood that the principles disclosed herein may be applicable to other transistor technologies as well.

SOI process technology is utilized in many radio-frequency (RF) circuits, including, for example, those involving high performance, low loss, high linearity switches. In such RF switching devices, performance advantage typically results from building a transistor in silicon, which sits on an insulator such as an insulating buried oxide (BOX). The BOX typically sits on a handle wafer, typically silicon, but can be glass, borosilicon glass, fused quartz, sapphire, silicon carbide, or any other electrically-insulating material.

An SOI transistor is viewed as a 4-terminal field-effect transistor (FET) device with gate, drain, source, and body terminals; or alternatively, as a 5-terminal device, with an addition of a substrate node. Such a substrate node can be biased and/or be coupled one or more other nodes of the transistor to, for example, improve linearity and/or loss performance of the transistor. Various examples related to SOI and/or other semiconductor active and/or passive devices are described herein in greater detail. Although various examples are described in the context of RF switches, it will be understood that one or more features of the present disclosure can also be implemented in other applications involving FETs and/or other semiconductor devices.

Figure 7:
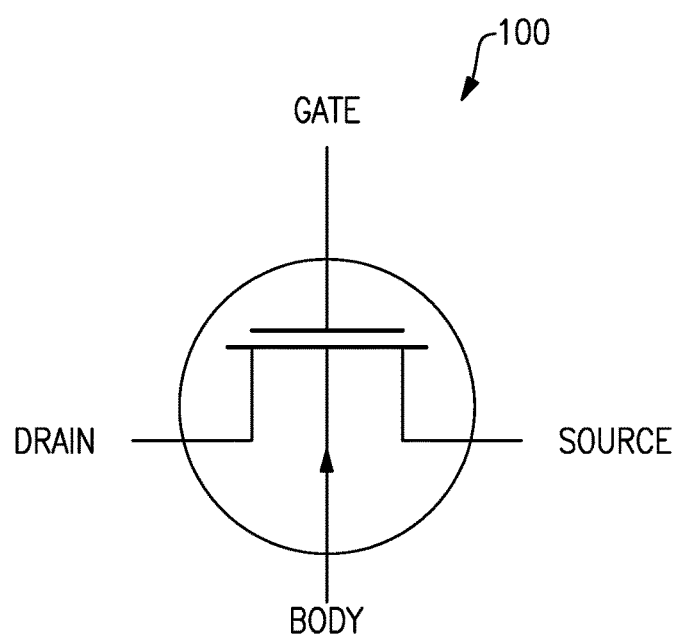
FIG. 7 shows a terminal representation of an SOI FET according to one or more embodiments.

FIG. 7 shows an example 4-terminal representation of an SOI FET 100 having nodes associated with a gate, a source, a drain and a body. It will be understood that in some embodiments, the source and the drain nodes can be reversed.

Figure 8A:
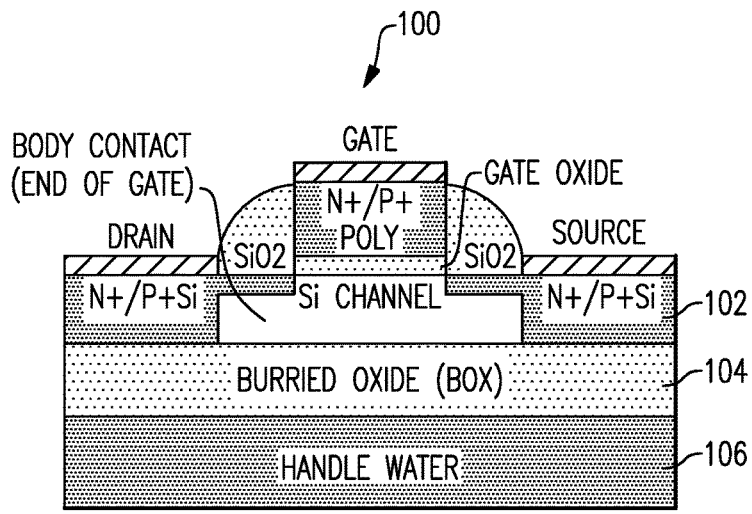
FIGS. 8A and 8B show side sectional and plan views, respectively, of an example SOI FET device according to one or more embodiments.
Figure 8B:
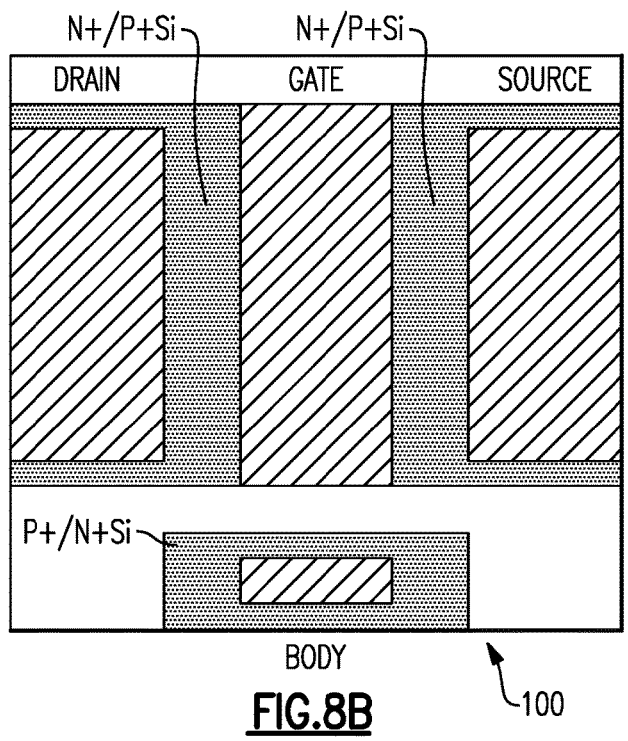

FIGS. 8A and 8B show side sectional and plan views, respectively, of an example SOI FET 100. The substrate of the FET 100 can be, for example, a silicon substrate associated with a handle wafer 106. Although described in the context of such a handle wafer, it will be understood that the substrate does not necessarily need to have material composition and/or functionality generally associated with a handle wafer. Furthermore, handle wafer and/or other substrate layers like that shown in FIG. 8A may be referred to herein as "bulk substrate," "bulk silicon," "handle substrate," "stabilizing substrate," or the like, and may comprise any suitable or desirable material, depending on the application.

An insulator layer such as a buried oxide (BOX) layer 104 is shown to be formed over the handle wafer 106, and a FET structure is shown to be formed in an active silicon device 102 over the BOX layer 104. In various examples described herein, and as shown in FIGS. 8A and 8B, the FET structure can be configured as an NPN or PNP device.

In the examples of FIGS. 8A and 8B, terminals for the gate, source, drain and body are shown to be configured and provided so as to allow operation of the FET. The BOX layer 104 may be formed on the semiconductor substrate 106. In certain embodiments, the BOX layer 104 can be formed from materials such as silicon dioxide or sapphire. Source and drain may be p-doped (or n-doped) regions whose exposed surfaces generally define rectangles. Source/drain regions can be configured so that source and drain functionalities are reversed. FIGS. 8A and 8B further show that a gate can be formed so as to be positioned between the source and the drain. The example gate is depicted as having a rectangular shape that extends along with the source and the drain. The FET 100 may further include a body contact. Electrically conductive features such as conductive vias and/or trenches may be used to connect to the drain, source, gate and/or body terminals of the FET in certain embodiments. Various examples of how such an electrically conductive feature can be implemented are described herein in greater detail.

Formations of the source and drain regions, and/or the body contact can be achieved by a number of known techniques. In some embodiments, the source and drain regions can be formed adjacent to the ends of their respective upper insulator layers, and the junctions between the body and the source/drain regions on the opposing sides of the body can extend substantially all the way down to the top of the buried oxide layer. Such a configuration can provide, for example, reduced source/drain junction capacitance. To form a body contact for such a configuration, an additional gate region can be provided.

Figure 9:
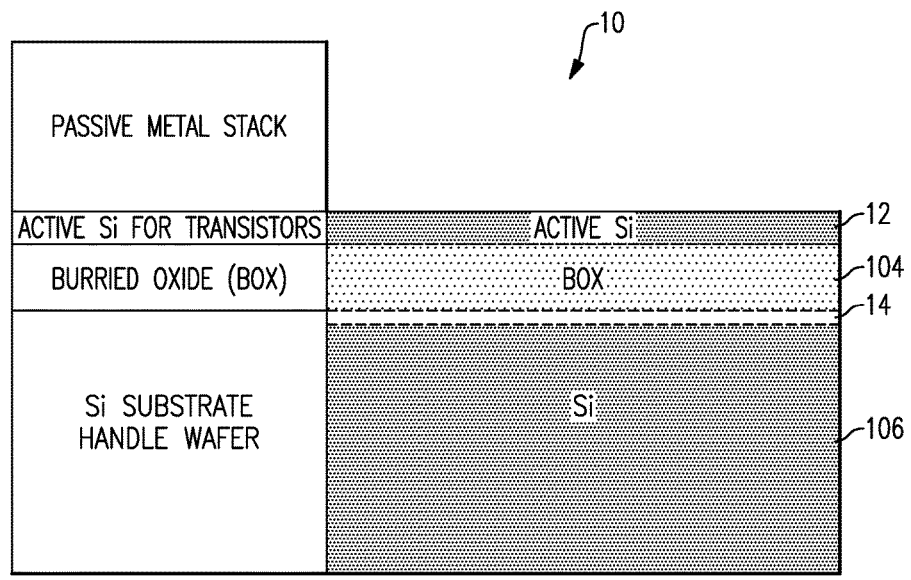
FIG. 9 shows a side sectional view of an SOI substrate that can be utilized to form an SOI FET device according to one or more embodiments.
Figure 10:
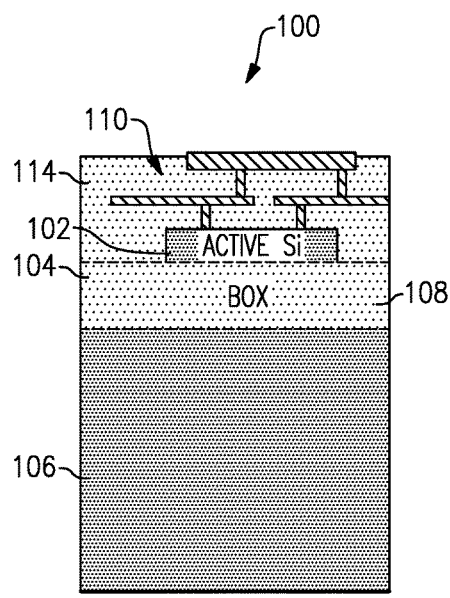
FIG. 10 shows a side sectional view of an SOI FET device according to one or more embodiments.

FIG. 9 shows a side sectional view of an SOI substrate 10 that can be utilized to form an SOI FET 100, as shown in FIG. 10, which may have an electrical connection for a substrate layer 106 (e.g., Si handle layer). In FIG. 9, an insulator layer such as a BOX layer 104 is shown to be formed over the Si handle layer 106. An active Si layer 12 is shown to be formed over the BOX layer 104.

In FIG. 10, an active Si device 102 is shown to be formed from the active Si layer 12 of FIG. 9. The device 100 includes a metal stack 110, which may facilitate electrical contact with the active Si device (e.g., a FET). In some embodiments, such a metal stack 110 can allow for certain conductive features of the FET 100 to be electrically connected to a terminal 112, or other electrically-coupled element. In the example of FIG. 10, a passivation layer 114 can be formed to cover some or all of the connections/metal stack 110 and/or active device 102.

In some embodiments, a trap-rich layer 14 can be implemented between the BOX layer 104 and the Si handle layer 106. In certain embodiments, an electrical connection to the Si handle layer 106 through one or more conductive feature(s) (e.g., substrate contact; not shown in the embodiment of FIG. 10) can eliminate or reduce the need for such a trap-rich layer, which is typically present to control charge at an interface between the BOX layer 104 and the Si handle layer 106, and can involve relatively costly process steps.

FIG. 11 shows a process 130 that can be implemented to fabricate an SOI FET having one or more features as described herein. FIG. 12 shows examples of various stages/structures associated with the various steps of the fabrication process of FIG. 11.

In block 132 of FIG. 11, an SOI substrate can be formed or provided. In state 140 of FIG. 12, such an SOI substrate can include an Si substrate 106 such as an Si handle layer, an oxide layer 104 over the Si substrate 106, and an active Si layer 12 over the oxide layer 104. Such an SOI substrate may or may not have a trap-rich layer between the oxide layer 104 and the Si substrate 106.

In block 134 of FIG. 11, one or more FETs can be formed with the active Si layer. In state 142 of FIG. 12, such FET(s) is depicted as 150.

In the example of FIGS. 11 and 12, it will be understood that the various blocks of the process 130 may or may not be performed in the example sequence shown. In some embodiments, conductive feature(s) such as one or more deep trenches can be formed and filled with poly prior to the formation of the FET(s). In some embodiments, such conductive feature(s) can be formed (e.g., cut and filled with a metal such as tungsten (W) after the formation of the FET(s). It will be understood that other variations in sequences associated with the example of FIGS. 11 and 12 can also be implemented.

In block 136 of FIG. 11, electrical connections can be formed for the FET(s). In state 146 of FIG. 12, such electrical connections are depicted as a metallization stack collectively identified by reference number 110. Such a metal stack 110 can electrically connect the FET(s) 150 to one or more terminals 112, or other electrical element or device (e.g., active or passive device). In the example state 146 of FIG. 12, a passivation layer 114 is shown to be formed to cover some or all of the connections/metallization stack 110 and/or FET(s) 150.

Figure 13:
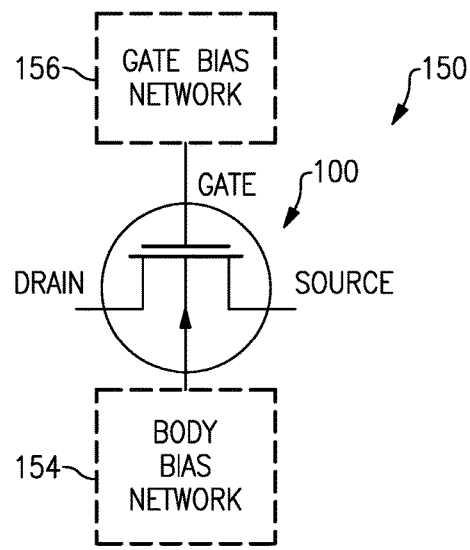
FIG. 13 shows a FET device according to one or more embodiments.

FIG. 13 shows that in some embodiments, an SOI FET 150 having one or more features as described herein can have its gate node biased by a gate bias network 156, its body node biased by a body bias network 154 and/or one or more additional nodes biased by a bias network. Examples related to such gate and body bias networks are described in U.S. Pub. No. 2014/0009214, titled "Circuits, Devices, Methods and Applications Related to Silicon-on-Insulator Based Radio-Frequency Switches," which is hereby incorporated by reference in its entirety.

Figure 14:
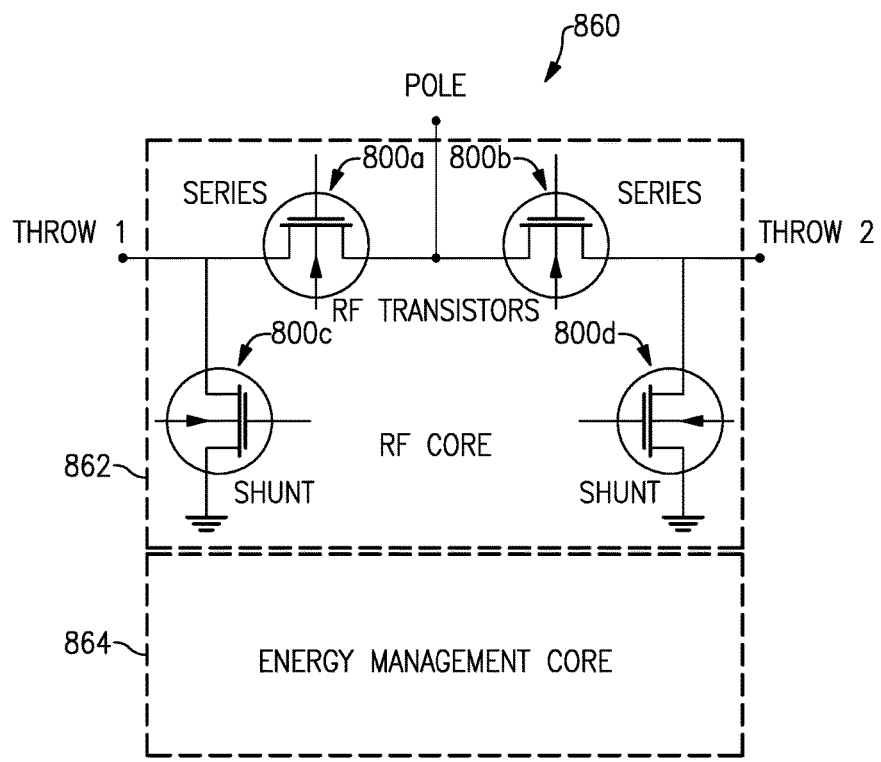
FIG. 14 shows an example of a radio-frequency (RF) switching configuration having an RF core and an energy management (EM) core.
Figure 15:
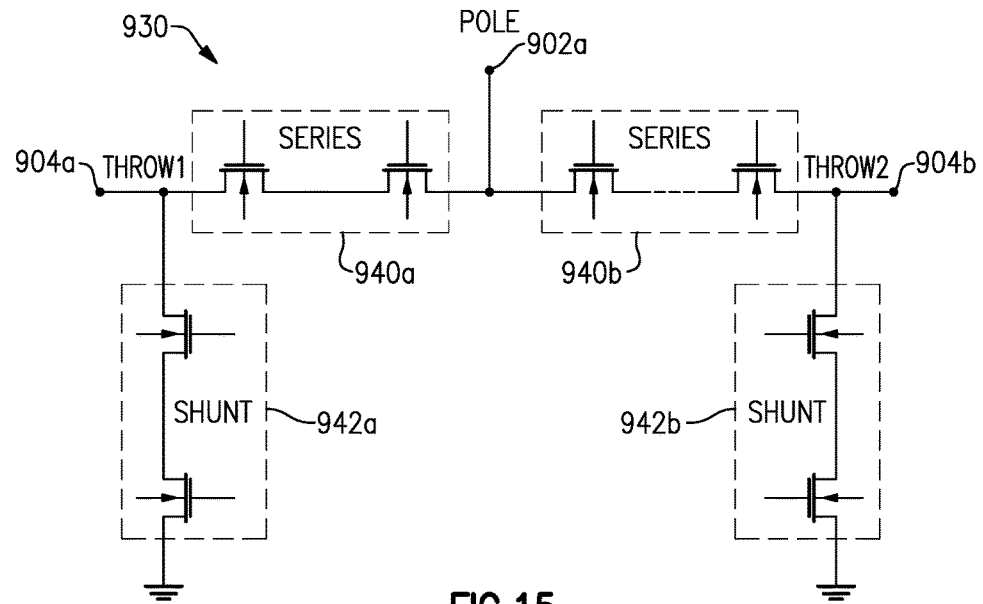
FIG. 15 shows an example of the RF core of FIG. 14, in which each of the switch arms includes a stack of FET devices.
Figure 16:
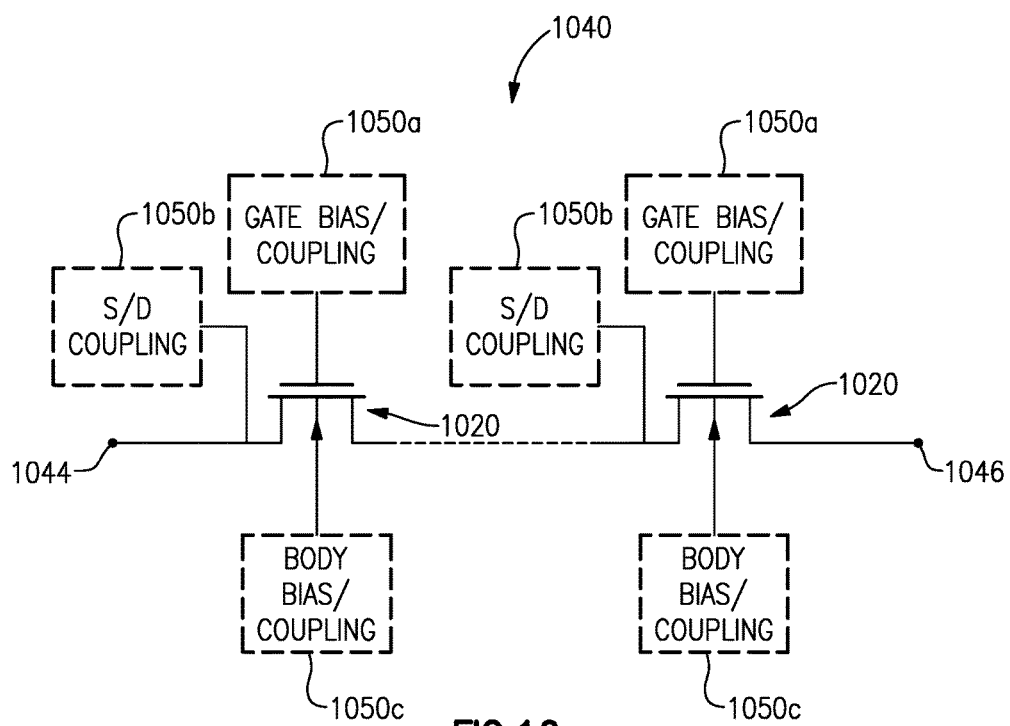

FIGS. 14-16 show that in some embodiments, SOI FETs having one or more features as described herein can be implemented in RF switching applications.

FIG. 14 shows an example of an RF switching configuration 860 having an RF core 862 and an energy management (EM) core 864. Additional details concerning such RF and EM cores are described in U.S. Pub. No. 2014/0009214, titled "Circuits, Devices, Methods and Applications Related to Silicon-on-Insulator Based Radio-Frequency Switches," which is incorporated by reference herein in its entirety. The example RF core 862 of FIG. 14 is shown as a single-pole-double-throw (SPDT) configuration in which series arms of transistors 800a, 800b are arranged between a pole and first and second throws, respectively. Nodes associated with the first and second throws are shown to be coupled to ground through their respective shunt arms of transistors 800c, 800d.

In the example of FIG. 14, the transistors between the pole node and the respective throw nodes are depicted as single transistors. In some implementations, such switching functionalities between the pole(s) and the throw(s) can be provided by switch arm segments, where each switch arm segment includes a plurality of transistors such as FETs.

An example RF core configuration 930 of an RF core having such switch arm segments is shown in FIG. 15. In the example of FIG. 15, the pole 902a and the first throw node 904a are shown to be coupled via a first switch arm segment 940a. Similarly, the pole 902a and the second throw node 904b are shown to be coupled via a second switch arm segment 940b. The first throw node 904a is shown to be capable of being shunted to an RF ground via a first shunt arm segment 942a. Similarly, the second throw node 904b is shown to be capable of being shunted to the RF ground via a second shunt arm segment 942b.

In an example operation, when the RF core 930 is in a state where an RF signal is being passed between the pole 902a and the first throw node 904a, all of the FETs in the first switch arm segment 940a can be in an ON state, and all of the FETs in the second switch arm segment 904b can be in an OFF state. The first shunt arm 942a for the first throw node 904a can have all of its FETs in an OFF state so that the RF signal is not shunted to ground as it travels from the pole 902a to the first throw node 904a. All of the FETs in the second shunt arm 942b associated with the second throw node 904b can be in an ON state so that any RF signals or noise arriving at the RF core 930 through the second throw node 904b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 940a, 940b, 942a, 942b) can include one or more semiconductor transistors such as FETs. In some embodiments, an FET may be capable of being in a first state or a second state and can include a gate, a drain, a source, and a body (sometimes also referred to as a substrate). In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state). In the example shown in FIG. 16, the gate of each of the FETs 1020 in a switch arm 1040 can be connected to a gate bias/coupling circuit to receive a gate bias signal and/or couple the gate to another part of the FET 1020 or the switch arm 1040. In some implementations, designs or features of the gate bias/coupling circuit(s) (e.g., 150a) can improve performance of the switch arm 1040.

Such improvements in performance can include, but are not limited to, device insertion loss, isolation performance, power handling capability and/or switching device linearity.

Silicon on Porous Silicon

Certain embodiments disclosed herein provide for the use of porous silicon technology in SOI devices, which may increase the resistivity and/or lower the permittivity of the SOI substrate to some degree. Porous silicon (p-Si), as described herein, may comprise elemental silicon that has introduced in its microstructure an amount of nanoporous holes, which may provide a relatively large surface-to-volume ratio, such as in the order of 500 $m^2/cm^3$ in certain embodiments.

Various embodiments disclosed herein provide for the formation/fabrication of porous silicon in silicon and/or SOI substrate processes. Such formation/fabrication may be through any suitable or desirable means or mechanism, such as anodization, stain etching (e.g., hydrofluoric acid and/or nitric acid based), bottom-up synthesis (e.g., using salt templates), or other process. The performance and/or characteristics of embodiments of silicon on porous silicon structures disclosed herein may depend on various parameters of the porous silicon, such as porosity and/or pore size/width. For example, the various embodiments disclosed herein may employ microporous silicon (e.g., pore width less than 2 nm), mesoporous silicon (e.g., pore width between 2 and 50 nm) and/or macroporous silicon (e.g., pore width greater than 50 nm).

Certain different structures and methods are disclosed herein for integrating a porous silicon substrate into silicon and/or SOI-based technologies. For example, FIG. 17 shows a process 1100 that can be implemented to form one or more porous silicon portions or regions in a silicon or SOI device or structure having one or more features as described herein. FIG. 18 shows examples of various stages of the fabrication processes of FIG. 17. The process(es) and/or structure(s) of FIGS. 17 and 18 may demonstrate how substrate resistivity may be increased and/or substrate permittivity decreased through selective creation of porous silicon under, for example, a passive portion of an SOI device.

At block 1102, the process 1100 involves providing an SOI wafer 1201, or portion thereof, having one or more device and/or connections, as shown at stage 1201. The associated example wafer structure 1201 may correspond to certain SOI processes disclosed above. Specifically, the structure 1201 may include one or more of a bulk substrate 1206, buried oxide (BOX) layer 1204, active semiconductor device(s) 1250, through-BOX via(s) 1208, electrical connections (e.g., metal stack) 1210, passivation layer 1214, and/or other features.

The substrate (e.g., silicon) layer 1206 may provide stability to the structure 1201, thereby allowing for formation of certain of the remaining layers that may not be formable without being associated with a mechanically-stabilizing substrate/wafer. For example, in certain embodiments, the passivation layer/area 1214 may be approximately 10 μm thick, wherein the substrate layer 1206 is substantially thicker (e.g., approximately 600 μm think) to provide mechanical stability to the passivation layer 1214 and associated components.

At block 1104, the process 1100 involves at least partially thinning or removing the backside substrate layer 1206. For example, as shown in structure 1203, the backside substrate 1206 may be thinned to result in a substrate layer 1211 thinner than the substrate layer 1206 shown in structure 1201.

In certain embodiments, wherein a plurality of elements are printed on a single die/chip, it may be desirable to at least partially prevent or reduce cross-talk between such elements. For example, separate elements may cross-talk through the substrate layer 1206/1211, where one or more components carrying RF signal(s) may capacitively couple to the substrate 1206, such that the substrate 1206 may carry such signal(s) laterally and couple to neighboring elements, possibly leading to performance degradation. Isolation of devices on a die/chip may be aided through the utilization of relatively high-resistivity/low-permittivity substrates, or substrate portions.

In certain embodiments, high-resistivity substrate (e.g., porous silicon) may be incorporated into an SOI structure through a layer transfer process. However, the exchange of a silicon substrate with a higher-resistivity substrate using layer transfer processes can be difficult and/or costly to execute. Certain embodiments disclosed herein provide for the selective conversion of silicon substrate for an RF device to porous silicon. For example, such conversion may be achieved using electro-chemical etching, or the like, to convert a portion of a silicon substrate from crystiline silicon to porous silicon. The step of selectively creating porous silicon in a silicon substrate is illustrated at block 1106. The corresponding structure 1205 includes a porous silicon area 1274, which may be formed substantially underneath a passive portion of a device. In certain embodiments, the porous silicon region 1274 does not laterally (i.e., in a side-to-side direction with respect to the orientation of FIG. 18) overlap with the active FET 1250. Therefore, structures disclosed herein may comprise active device(s) (e.g., FET(s) 1250) formed on or above a buried oxide layer 1204, which is disposed on a silicon substrate having at least a portion thereof converted to porous silicon.

As demonstrated in FIGS. 17 and 18, once the frontside completed silicon or SOI wafer has been thinned, which may be performed using standard technology, the backside of the wafer may then be patterned to provide an opening in the photoresist in an area where porous silicon is desired. The silicon in the photoresist opening can then be converted into porous silicon using a number of different methods, such as electrochemical etching using an HF based electrolyte. The depth and/or porosity of the porous silicon layer may be varied to meet performance requirements using certain porous silicon creation process controls. In certain embodiments, as shown in FIG. 18, the porous silicon 1274 may be formed substantially under a passive area of the structure 1205 as a mechanism for improving passive performance without substantially affecting active device performance. Although the example depicted in FIG. 18 shows the selective use of porous silicon under a passive area of a device, in certain embodiments, porous silicon may be selectively created under active areas, and/or between active and passive areas of circuits and devices.

The porous silicon portion 1274 may provide a substantial increase in resistivity and decrease in dielectric constant value relative to the surrounding silicon substrate 1211. Although porous silicon may generally suffer from relatively weaker mechanical stability compared to crystalline silicon, where the porous silicon 1274 is formed only in selective areas, the overall mechanical stability of the substrate may be adequate for handling and/or other purposes in certain embodiments.

In the examples of FIGS. 17 and 18, it will be understood that the various blocks, or stages, may or may not be performed in the example sequences illustrated. Furthermore, certain of the illustrated and described steps may be omitted in certain embodiments, or additional steps may be implemented that are not explicitly described while remaining within the scope of the present disclosure.

In certain embodiments, a porous silicon layer is not used selectively, but is synthesized under an entire device, die or wafer, or under expansive portions thereof. FIG. 19 shows a process 1300 that can be implemented to form a layer of porous silicon as a backside substrate for a silicon or SOI device or structure having one or more features as described herein. FIG. 20 shows examples of various stages of the fabrication processes of FIG. 19. The process(es) and/or structure(s) of FIGS. 19 and 20 may demonstrate how substrate resistivity may be increased and/or substrate permittivity decreased through full substrate layer conversion to porous silicon under a silicon or SOI device.

At block 1302, the process 1300 involves providing an SOI wafer 1401, or portion thereof, having one or more device and/or connections, as shown at stage 1401. The associated example wafer structure 1401 may correspond to certain SOI processes disclosed above. Specifically, the structure 1401 may include one or more of a bulk substrate 1406, buried oxide (BOX) layer 1404, active semiconductor device(s) 1450, through-BOX via(s) 1408, electrical connections (e.g., metal stack) 1410, passivation layer 1414, and/or other features.

The substrate (e.g., silicon) layer 1406 may provide stability to the structure 1401, thereby allowing for formation of certain of the remaining layers that may not be formable without being associated with a mechanically-stabilizing substrate/wafer. For example, in certain embodiments, the passivation layer/area 1414 may be approximately 10 μm thick, wherein the substrate layer 1406 is substantially thicker (e.g., approximately 600 μm think) to provide mechanical stability to the passivation layer 1414 and associated components.

At block 1304, the process 1300 involves at least partially thinning or removing the backside substrate layer 1406. For example, as shown in structure 1403, the backside substrate 1406 may be thinned to result in a substrate layer 1411 thinner than the substrate layer 1406 shown in structure 1401.

In certain embodiments, after the frontside completed silicon or SOI wafer has been thinned, which may be performed using standard technology, the entire silicon substrate 1411, or a substantial portion thereof (e.g., more than 50%) may then be converted into porous silicon 1474, which may be performed in any suitable or desirable manner, such as through electrochemical etching using an HF based electrolyte. The depth and/or porosity of the porous silicon layer 1474 may be varied to meet performance requirements with certain porous silicon creation process controls.

The resulting structure 1405 includes a layer of porous silicon 1474 under an entire SOI device, entire wafer, and/or entire die. Although such expansive conversion of silicon to porous silicon may have a negative impact on mechanical stability, in certain embodiments, the overall stability of the structure 1405 and/or associated wafer or die may nevertheless be sufficient for certain purposes.

Figures 21, 22:
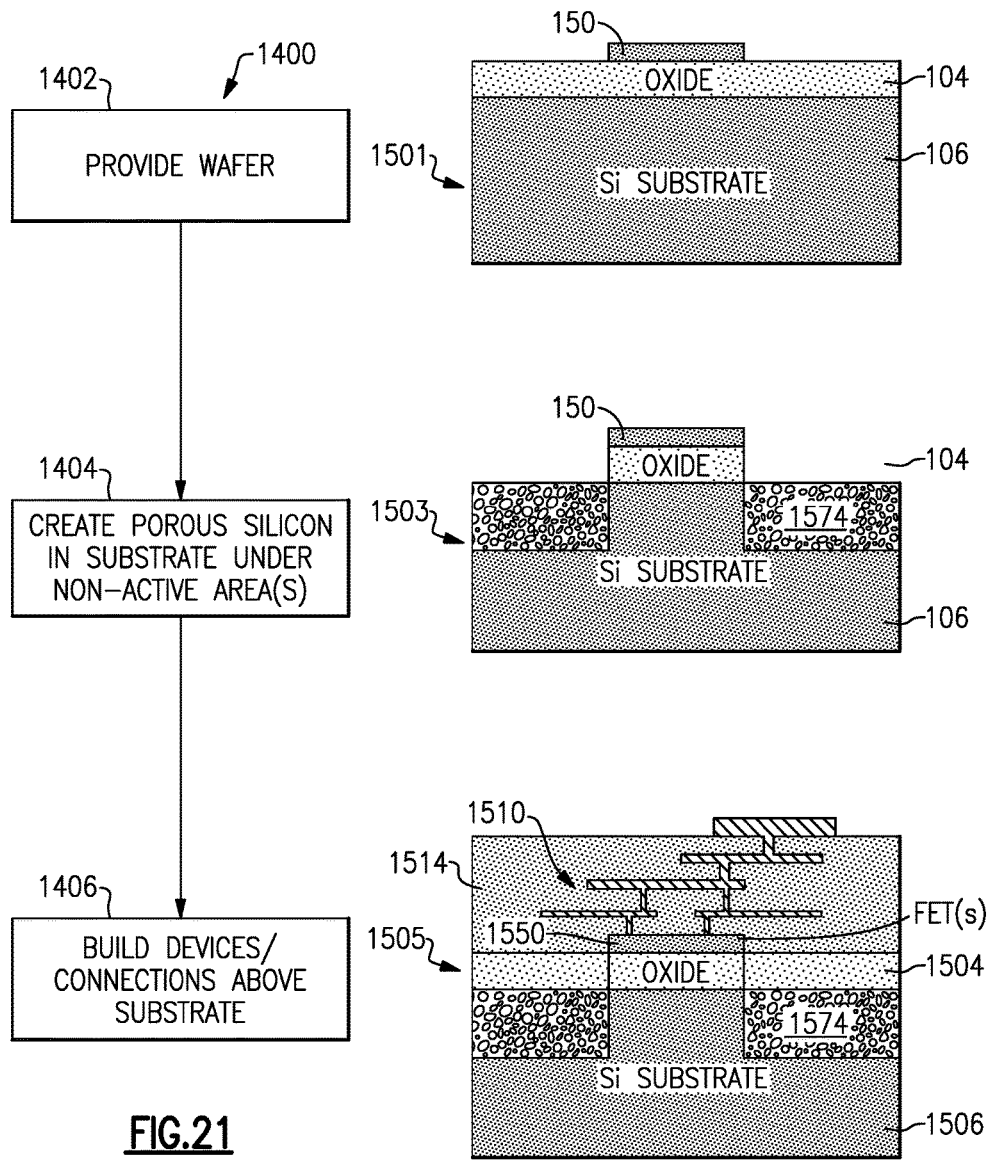
FIG. 21 shows a process for creating porous silicon region(s) from the front side of a silicon or SOI device.
FIG. 22 shows examples of various stages of the fabrication processes of FIG. 21.

The embodiments illustrated in FIGS. 17-20 may correspond to processes for forming porous silicon layers and/or regions after fabrication of the semiconductor SOI wafer. Certain embodiments disclosed herein provide for the formation of porous silicon before frontside processing. For example, FIGS. 21 and 22 represent a process for creating porous silicon region(s) from the front side of a silicon or SOI device 1501, rather than from the backside, as was shown in FIGS. 17-20.

At block 1402, the process 1400 involves providing a wafer 1501 having one or more layers including a silicon substrate 106. The wafer 1501 may further include an oxide layer 104 and an active silicon layer 150 for one or more active devices (e.g., FET(s)). At block 1404, the process 1400 may involve selectively creating porous silicon regions during the frontside processing of the structure 1503. The wafer 1501 may be patterned to form one or more openings in the photoresist in the area(s) where porous silicon is desired. The active silicon and/or oxide layers may then be etched to at least partially expose the underlying silicon substrate 106. The top surface of the exposed silicon substrate, and a portion of the substrate thereunder, may then be converted to porous silicon 1574 using any suitable or desirable technique, such as electrochemical etching using an HF based electrolyte. The depth and/or porosity of the porous silicon layer 1574 may be varied to meet performance requirements using certain porous silicon creation process controls.

A planarizing material, such as a silicon oxide or the like, may then be grown and a planarizing process, such as chemical-mechanical planarization (CMP) may then be performed to provide a wafer that can be processed using standard frontside processing for the relevant technology. The resulting structure may include high-resistivity porous silicon under at least a portion of the wafer without requiring backside porous silicon conversion.

Substrate with Porous Silicon Layer

Figure 23:
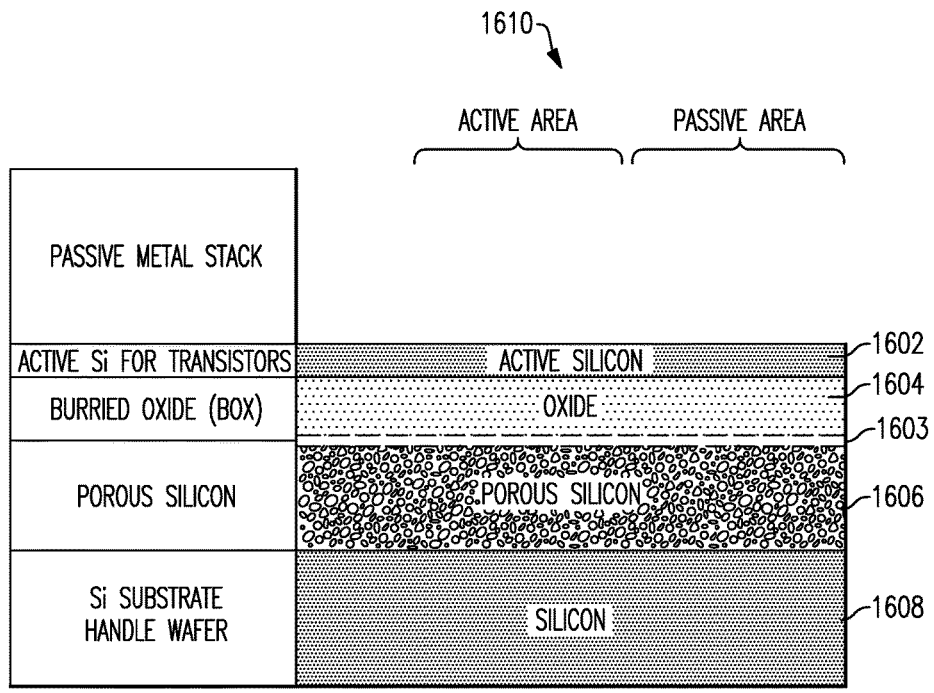
FIG. 23 shows a side sectional view of an SOI substrate that can be utilized to form an SOI FET device according to one or more embodiments.

Certain embodiments disclosed herein provide for creation of a porous silicon layer within an SOI substrate, such as a trap-rich SOI substrate. For example, a porous silicon layer may be synthesized within the SOI substrate fabrication process, as shown in FIG. 23. In certain embodiments, a porous silicon layer 1606 is created on a top surface/region of a handle wafer of the SOI substrate using any suitable or desirable technique, such as electrochemical etching using an HF based electrolyte. The depth and/or porosity of the porous silicon layer 1606 may be varied to meet performance requirements using certain porous silicon creation process controls.

In certain embodiments, it may be desirable to grow a trap rich layer 1603, such as polysilicon film or the like, onto the porous silicon surface. In certain embodiments, it may be desirable to grow a silicon oxide 1604 or other film on the handle wafer in order to improve wafer bonding. The handle wafer (silicon layer 1608, porous silicon layer 1606) with the integrated trap rich 1603 (e.g., polysilicon) layer and/or silicon oxide 1604 layer may then be wafer-bonded to an active silicon wafer 1602 to create an SOI substrate 1610 with an underlying porous silicon region 1606.

The substrate 1610 may be provided by a substrate-provider in the condition shown in FIG. 23. When wafer-bonding is performed, such bonding may be done to a porous silicon layer, rather than a crystalline silicon layer as is done in certain other processes. Although a trap-rich layer 1603 is shown, certain embodiments don not include a trap-rich layer.

Figure 24:
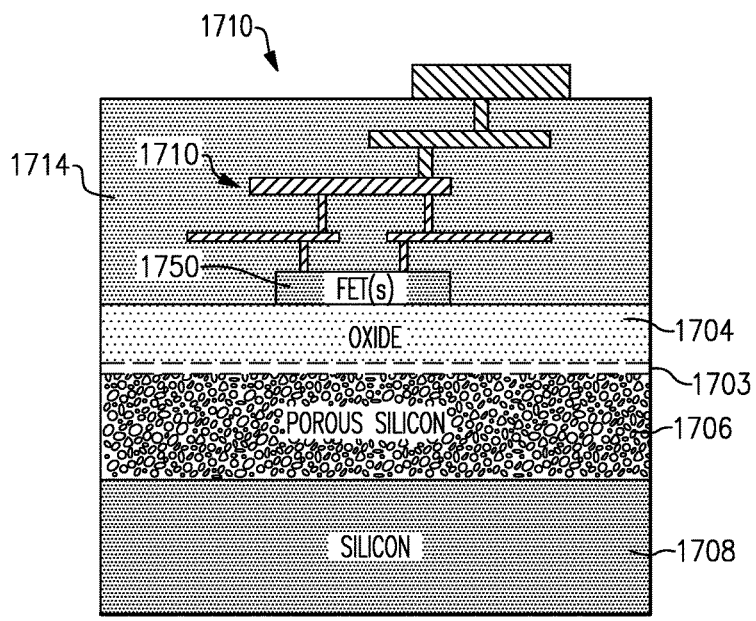
FIG. 24 shows a side sectional view of an SOI FET device according to one or more embodiments.

By building a circuit on top of a wafer including a layer of porous silicon 1606, the resulting structure 1710 shown in FIG. 24 may benefit from higher resistivity, lower permittivity, and/or other benefits.

In FIG. 24, an active Si device 1750 is shown to be formed from the active Si layer 1602 of FIG. 23. The device 1710 includes a metal stack 1710, which may facilitate electrical contact with the active Si device (e.g., a FET). In some embodiments, such a metal stack 1710 can allow for certain conductive features of the FET 1750 to be electrically connected to a terminal or other electrically-coupled element. In the example of FIG. 24, a passivation layer 1714 can be formed to cover some or all of the connections/metal stack 1710 and/or active device 1750.

In some embodiments, a trap-rich layer 1703 can be implemented between the oxide layer 1704 and the porous silicon layer 1706. In certain embodiments, an electrical connection to the porous silicon layer 1706 through one or more conductive feature(s) (e.g., substrate contact; not shown in the embodiment of FIG. 17) can eliminate or reduce the need for a trap-rich layer, which may be present generally to control charge at an interface between the oxide layer 1704 and the Si handle layer (porous silicon layer 1706 and/or silicon layer 1708).

Examples Related to Switch Configurations

As described herein, FET devices having one or more features of the present disclosure can be utilized to implement an SPDT switch configuration. It will be understood that FET devices having one or more features of the present disclosure can also be implemented in other switch configurations.

Figure 25:
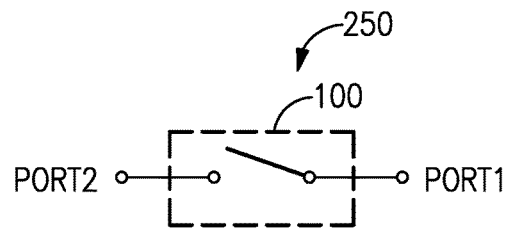
FIG. 25 shows a switch assembly implemented in a single-pole-single-throw (SPST) configuration utilizing an SOI FET device.

FIGS. 25-35 show examples related to various switch configurations that can be implemented utilizing FET devices such as SOI FET devices having one or more features as described herein. For example, FIG. 25 shows a switch assembly 250 implemented in a single-pole-single-throw (SPST) configuration. Such a switch can include an SOI FET device 100 implemented between a first port (Port1) and a second port (Port2).

Figure 26:
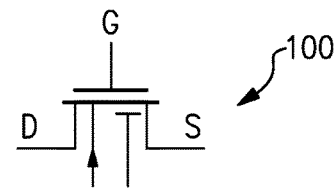
FIG. 26 shows that in some embodiments, the SOI FET device of FIG. 25 can include a substrate biasing/coupling feature as described herein.

FIG. 26 shows that in some embodiments, the SOI FET device 100 of FIG. 25 can include a substrate biasing/coupling feature as described herein. The source node of the SOI FET device 100 can be connected to the first port (Port1), and the drain node of the SOI FET device 100 can be connected to the second port (Port2). As described herein, the SOI FET device 100 can be turned ON to close the switch 250 (of FIG. 25) between the two ports, and turned OFF to open the switch 250 between the two ports.

It will be understood that the SOI FET device 100 of FIGS. 25 and 26 can include a single FET, or a plurality of FETs arranged in a stack. It will also be understood that each of various SOI FET devices 100 of FIGS. 27-35 can include a single FET, or a plurality of FETs arranged in a stack.

Figure 27:
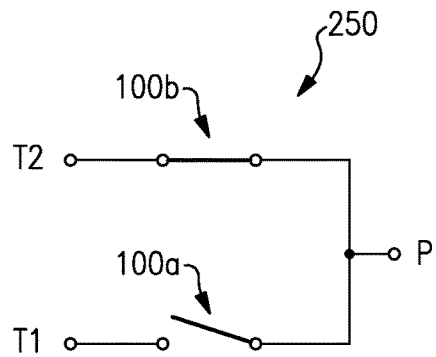
FIG. 27 shows an example of how two SPST switches having one or more features as described herein can be utilized to form a switch assembly having a single-pole-double-throw (SPDT) configuration.
Figure 28:
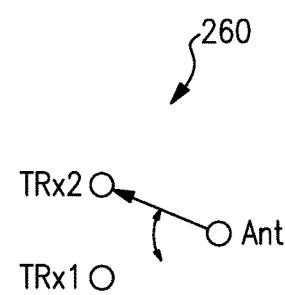
FIG. 28 shows that the switch assembly of FIG. 27 can be utilized in an antenna switch configuration.

FIG. 27 shows an example of how two SPST switches (e.g., similar to the examples of FIGS. 25, 26) having one or more features as described herein can be utilized to form a switch assembly 250 having a single-pole-double-throw (SPDT) configuration. FIG. 28 shows, in a SPDT representation, that the switch assembly 250 of FIG. 27 can be utilized in an antenna switch configuration 260. It will be understood that one or more features of the present disclosure can also be utilized in switching applications other than antenna switching application.

It is noted that in various switching configuration examples of FIGS. 25-35, switchable shunt paths are not shown for simplified views of the switching configurations. Accordingly, it will be understood that some or all of switchable paths in such switching configurations may or may not have associated with them switchable shunt paths.

Referring to the examples of FIGS. 27 and 28, it is noted that such examples may be similar to other examples described herein. In some embodiments, the single pole (P) of the switch assembly 250 of FIG. 27 can be utilized as an antenna node (Ant) of the antenna switch 260, and the first and second throws (T1, T2) of the switch assembly 250 of FIG. 27 can be utilized as TRx1 and TRx2 nodes, respectively, of the antenna switch 260. Although each of the TRx1 and TRx2 nodes is indicated as providing transmit (Tx) and receive (Rx) functionalities, it will be understood that each of such nodes can be configured to provide either or both of such Tx and Rx functionalities.

In the examples of FIGS. 27 and 28, the SPDT functionality is shown to be provided by two SPST switches 100a, 100b, with the first SPST switch 100a providing a first switchable path between the pole P (Ant in FIG. 28) and the first throw T1 (TRx1 in FIG. 28), and the second SPST switch 100b providing a second switchable path between the pole P (Ant in FIG. 28) and the second throw T2 (TRx2 in FIG. 28). Accordingly, selective coupling of the pole (Ant) with either of the first throw T1 (TRx1) and the second throw T2 (TRx2) can be achieved by selective switching operations of the first and second SPST switches. For example, if a connection is desired between the pole (Ant) and the first throw T1 (TRx1), the first SPST switch 100a can be closed, and the second SPST switch 100b can be opened. Similarly, and as depicted in the example state in FIGS. 27 and 28, if a connection is desired between the pole (Ant) and the second throw T2 (TRx2), the first SPST switch 100a can be opened, and the second SPST switch 100b can be closed.

In the foregoing switching examples of FIGS. 27 and 28, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Figure 29:
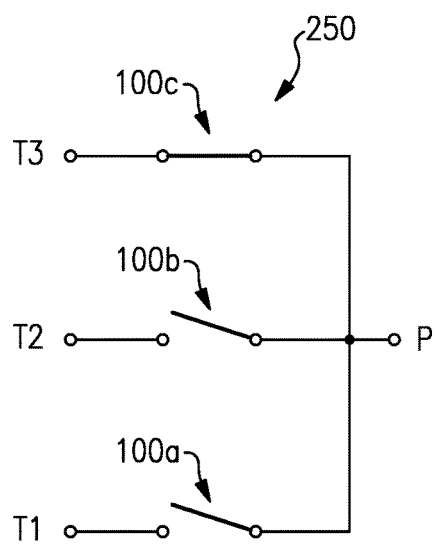
FIG. 29 shows an example of how three SPST switches having one or more features as described herein can be utilized to form a switch assembly having a single-pole-triple-throw (SP3T) configuration.
Figure 30:
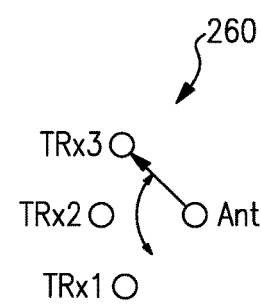
FIG. 30 shows that the switch assembly of FIG. 29 can be utilized in an antenna switch configuration.

FIG. 29 shows an example of how three SPST switches (e.g., similar to the examples of FIGS. 25, 26) having one or more features as described herein can be utilized to form a switch assembly 250 having a single-pole-triple-throw (SP3T) configuration. FIG. 30 shows, in a SP3T representation, that the switch assembly 250 of FIG. 30 can be utilized in an antenna switch configuration 260. It will be understood that one or more features of the present disclosure can also be utilized in switching applications other than antenna switching application.

Referring to the examples of FIGS. 29 and 30, it is noted that the SP3T configuration can be an extension of the SPDT configuration of FIGS. 27 and 28. For example, the single pole (P) of the switch assembly 250 of FIG. 29 can be utilized as an antenna node (Ant) of the antenna switch 260, and the first, second and third throws (T1, T2, T3) of the switch assembly 250 of FIG. 29 can be utilized as TRx1, TRx2 and TRx3 nodes, respectively, of the antenna switch 260. Although each of the TRx1, TRx2 and TRx3 nodes is indicated as providing transmit (Tx) and receive (Rx) functionalities, it will be understood that each of such nodes can be configured to provide either or both of such Tx and Rx functionalities.

In the examples of FIGS. 29 and 30, the SP3T functionality is shown to be provided by three SPST switches 100a, 100b, 100c, with the first SPST switch 100a providing a first switchable path between the pole P (Ant in FIG. 29) and the first throw T1 (TRx1 in FIG. 30), the second SPST switch 100b providing a second switchable path between the pole P (Ant in FIG. 30) and the second throw T2 (TRx2 in FIG. 30), and the third SPST switch 100c providing a third switchable path between the pole P (Ant in FIG. 30) and the third throw T3 (TRx3 in FIG. 30). Accordingly, selective coupling of the pole (Ant) with one of the first throw T1 (TRx1), the second throw T2 (TRx2), and the third throw T3 (TRx3) can be achieved by selective switching operations of the first, second and third SPST switches. For example, if a connection is desired between the pole (Ant) and the first throw T1 (TRx1), the first SPST switch 100a can be closed, and each of the second and third SPST switches 100b, 100c can be opened. If a connection is desired between the pole (Ant) and the second throw T2 (TRx2), the second SPST switch 100b can be closed, and each of the first and third SPST switches 100a, 100c can be opened. Similarly, and as depicted in the example state in FIGS. 29 and 30, if a connection is desired between the pole (Ant) and the third throw T3 (TRx3), each of the first and second SPST switches 100a, 100b can be opened, and the third SPST switch 100c can be closed.

In the foregoing switching examples of FIGS. 29 and 30, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Based on the foregoing examples of SPST, SPDT and SP3T configurations of FIGS. 25-30, one can see that other switching configurations involving a single pole (SP) can be implemented utilizing SOI FET devices having one or more features as described herein. Thus, it will be understood that a switch having a SPNT can be implemented utilizing one or more SOI FET devices as described herein, where the quantity N is a positive integer.

Figure 31:
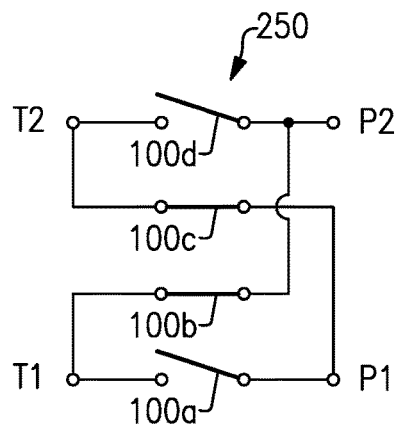
FIG. 31 shows an example of how four SPST switches having one or more features as described herein can be utilized to form a switch assembly having a double-pole-double-throw (DPDT) configuration.
Figure 32:
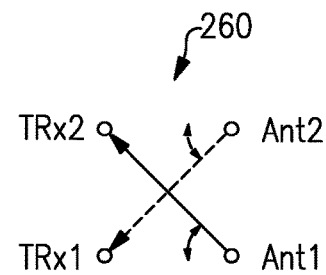
FIG. 32 shows that the switch assembly of FIG. 31 can be utilized in an antenna switch configuration.
Figure 33:
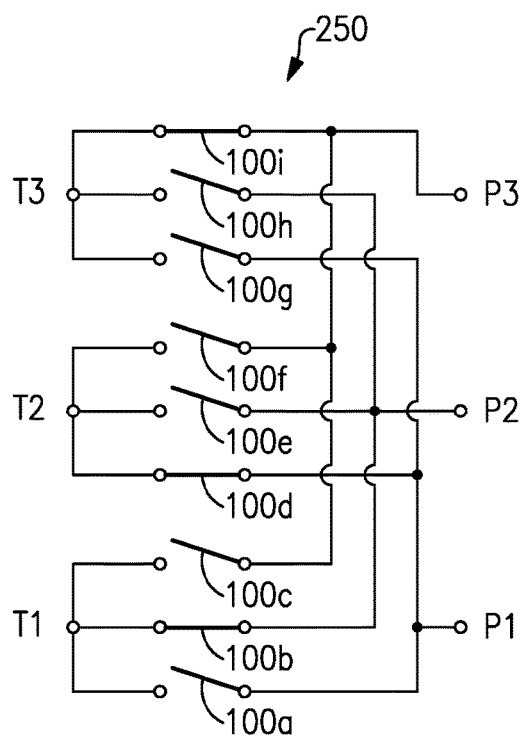
FIG. 33 shows an example of how nine SPST switches having one or more features as described herein can be utilized to form a switch assembly having a 3-pole-3-throw (3P3T) configuration.
Figure 34:
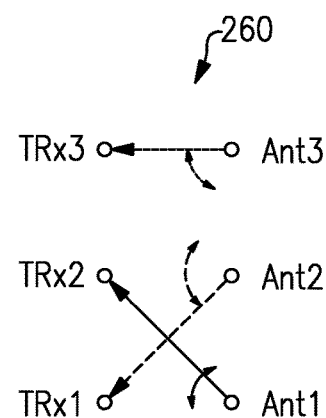
FIG. 34 shows that the switch assembly of FIG. 33 can be utilized in an antenna switch configuration.

Switching configurations of FIGS. 27-30 are examples where a single pole (SP) is connectable to one or more of a plurality of throws to provide the foregoing SPNT functionality. FIGS. 31-34 show examples where more than one poles can be provided in switching configurations. FIGS. 31 and 32 show examples related to a double-pole-double-throw (DPDT) switching configuration that can utilize a plurality of SOI FET devices having one or more features as described herein. Similarly, FIGS. 33 and 34 show examples related to a triple-pole-triple-throw (3P3T) switching configuration that can utilize a plurality of SOI FET devices having one or more features as described herein.

It will be understood that a switching configuration utilizing a plurality of SOI FET devices having one or more features as described herein can include more than three poles. Further, it is noted that in the examples of FIGS. 31-34, the number of throws (e.g., 2 in FIGS. 31 and 32, and 3 in FIGS. 33 and 34) are depicted as being the same as the corresponding number of poles for convenience. However, it will be understood that the number of throws may be different than the number of poles.

FIG. 31 shows an example of how four SPST switches (e.g., similar to the examples of FIGS. 25, 26) having one or more features as described herein can be utilized to form a switch assembly 250 having a DPDT configuration. FIG. 32 shows, in a DPDT representation, that the switch assembly 250 of FIG. 31 can be utilized in an antenna switch configuration 260. It will be understood that one or more features of the present disclosure can also be utilized in switching applications other than antenna switching application.

In the examples of FIGS. 31 and 32, the DPDT functionality is shown to be provided by four SPST switches 100a, 100b, 100c, 100d. The first SPST switch 100a is shown to provide a switchable path between a first pole P1 (Ant1 in FIG. 32) and a first throw T1 (TRx1 in FIG. 32), the second SPST switch 100b is shown to provide a switchable path between a second pole P2 (Ant2 in FIG. 32) and the first throw T1 (TRx1 in FIG. 32), the third SPST switch 100c is shown to provide a switchable path between the first pole P1 (Ant1 in FIG. 32) and a second throw T2 (TRx2 in FIG. 32), and the fourth SPST switch 100d is shown to provide a switchable path between the second pole P2 (Ant2 in FIG. 32) and the second throw T2 (TRx2 in FIG. 32). Accordingly, selective coupling between one or more of the poles (antenna nodes) with one or more of the throws (TRx nodes) can be achieved by selective switching operations of the four SPST switches 100a, 100b, 100c, 100d. Examples of such switching operations are described herein in greater detail.

FIG. 33 shows an example of how nine SPST switches (e.g., similar to the examples of FIGS. 25, 26) having one or more features as described herein can be utilized to form a switch assembly 250 having a 3P3T configuration. FIG. 34 shows, in a 3P3T representation, that the switch assembly 250 of FIG. 33 can be utilized in an antenna switch configuration 260. It will be understood that one or more features of the present disclosure can also be utilized in switching applications other than antenna switching application.

Referring to the examples of FIGS. 33 and 34, it is noted that the 3P3T configuration can be an extension of the DPDT configuration of FIGS. 31 and 32. For example, a third pole (P3) can be utilized as a third antenna node (Ant3), and a third throw (T3) can be utilized as a third TRx node (TRx3). Connectivity associated with such third pole and third throw can be implemented similar to the examples of FIGS. 31 and 32.

In the examples of FIGS. 33 and 34, the 3P3T functionality is shown to be provided by nine SPST switches 100a-100i. Such nine SPST switches can provide switchable paths as listed in Table 1.

TABLE 1

| SPST switch | Pole | Throw |
| --- | --- | --- |
| 100a | P1 | T1 |
| 100b | P2 | T1 |
| 100c | P3 | T1 |
| 100d | P1 | T2 |
| 100e | P2 | T2 |
| 100f | P3 | T2 |
| 100g | P1 | T3 |
| 100h | P2 | T3 |
| 100i | P3 | T3 |

Based on the example of FIGS. 33 and 34, and Table 1, one can see that selective coupling between one or more of the poles (antenna nodes) with one or more of the throws (TRx nodes) can be achieved by selective switching operations of the nine SPST switches 100a-100i.

In many applications, switching configurations having a plurality of poles and a plurality of throws can provide increased flexibility in how RF signals can be routed therethrough. FIGS. 35A-35E show examples of how a DPDT switching configuration such as the examples of FIGS. 31 and 32 can be operated to provide different signal routing functionalities. It will be understood that similar control schemes can also be implemented for other switching configurations, such as the 3P3T examples of FIGS. 33 and 34.

In some wireless front-end architectures, two antennas can be provided, and such antennas can operate with two channels, with each channel being configured for either or both of Tx and Rx operations. For the purpose of description, it will be assumed that each channel is configured for both Tx and Rx operations (TRx). However, it will be understood that each channel does not necessarily need to have such TRx functionality. For example, one channel can be configured for TRx operations, while the other channel can be configured for Rx operation. Other configurations are also possible.

In the foregoing front-end architectures, there may be relatively simple switching states including a first state and a second state. In the first state, the first TRx channel (associated with the node TRx1) can operate with the first antenna (associated with the node Ant1), and the second TRx channel (associated with the node TRx2) can operate with the second antenna (associated with the node Ant2). In the second state, connections between the antenna nodes and the TRx nodes can be swapped from the first state. Accordingly, the first TRx channel (associated with the node TRx1) can operate with the second antenna (associated with the node Ant2), and the second TRx channel (associated with the node TRx2) can operate with the first antenna (associated with the node Ant1).

In some embodiments, such two states of the DPDT switching configuration can be controlled by a one-bit logic scheme, as shown in the example logic states in Table 2.

TABLE 2

| State | Control logic | TRx1-Ant1 connection | TRx1-Ant2 connection | TRx2-Ant1 connection | TRx2-Ant2 connection |
| --- | --- | --- | --- | --- | --- |
| 1 | 0 | Yes | No | No | Yes |
| 2 | 1 | No | Yes | Yes | No |

Figure 35A:
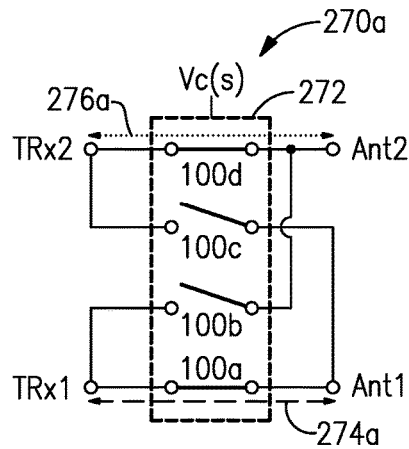
FIGS. 35A-35E show examples of how a DPDT switching configuration can be operated to provide different signal routing functionalities.
Figure 35B:
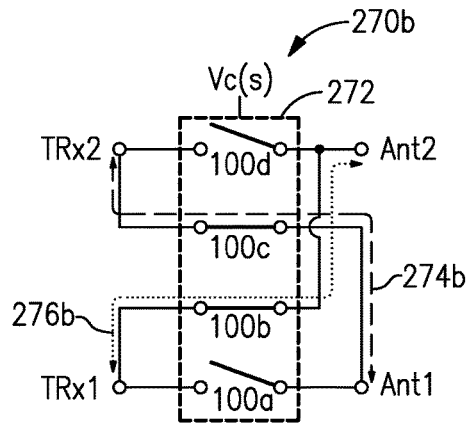

The first state (State 1) of the example of Table 2 is depicted in FIG. 35A as 270a, where the TRx1-Ant1 connection is indicated as path 274a, and the TRx2-Ant2 connection is indicated as path 276a. A control signal, representative of the control logic of Table 2, provided to the assembly (272) of the four SPST switches (100a, 100b, 100c, 100d) is collectively indicated as Vc(s). Similarly, the second state (State 2) of the example of Table 2 is depicted in FIG. 35B as 270b, where the TRx1-Ant2 connection is indicated as path 276b, and the TRx2-Ant1 connection is indicated as path 274b.

In some front-end architectures having a DPDT switching configuration, it may be desirable to have additional switching states. For example, it may be desirable to have only one path active among the two TRx channels and the two antennas. In another example, it may be desirable to disable all signal paths through the DPDT switch. Examples of 3-bit control logic that can be utilized to achieve such examples switching states are listed in Table 3.

TABLE 3

| State | Control logic (Vc1, Vc2, Vc3) | TRx1-Ant1 connection | TRx1-Ant2 connection | TRx2-Ant1 connection | TRx2-Ant2 connection |
|---|---|---|---|---|---|
| 1 | 0, 0, 0 | No | No | No | No |
| 2 | 0, 0, 1 | Yes | No | No | Yes |
| 3 | 0, 1, 0 | Yes | No | No | No |
| 4 | 0, 1, 1 | No | Yes | Yes | No |
| 5 | 1, 0, 0 | No | Yes | No | No |

Figure 35C:
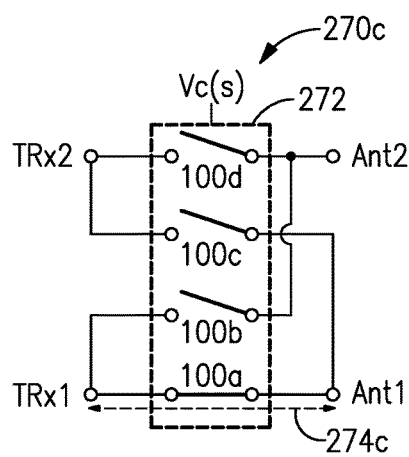
Figure 35D:
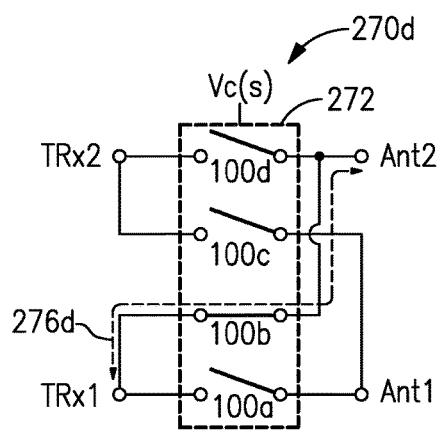
Figure 35E:
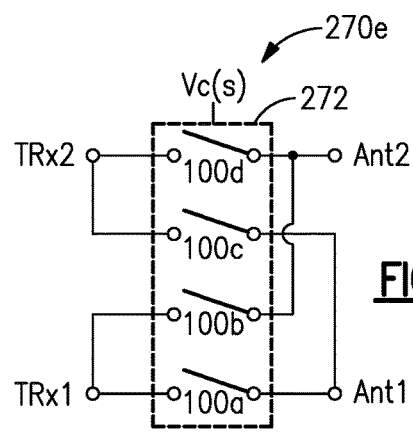

The first state (State 1) of the example of Table 3 is depicted in FIG. 35E as 270e, where all of the TRx-Ant paths are disconnected. A control signal indicated as Vc(s) in FIG. 35E and as listed in Table 3 can be provided to the assembly (272) of the four SPST switches (100a, 100b, 100c, 100d) to effectuate such a switching state.

The second state (State 2) of the example of Table 3 is depicted in FIG. 35A as 270a, where the TRx1-Ant1 connection is indicated as path 274a, and the TRx2-Ant2 connection is indicated as path 276a. A control signal indicated as Vc(s) in FIG. 35A and as listed in Table 3 can be provided to the assembly (272) of the four SPST switches (100a, 100b, 100c, 100d) to effectuate such a switching state.

The third state (State 3) of the example of Table 3 is depicted in FIG. 35C as 270c, where the TRx1-Ant1 connection is indicated as path 274c, and all other paths are disconnected. A control signal indicated as Vc(s) in FIG. 35C and as listed in Table 3 can be provided to the assembly (272) of the four SPST switches (100a, 100b, 100c, 100d) to effectuate such a switching state.

The fourth state (State 4) of the example of Table 3 is depicted in FIG. 35B as 270b, where the TRx1-Ant2 connection is indicated as path 276b, and the TRx2-Ant1 connection is indicated as path 274b. A control signal indicated as Vc(s) in FIG. 35B and as listed in Table 3 can be provided to the assembly (272) of the four SPST switches (100a, 100b, 100c, 100d) to effectuate such a switching state.

The fifth state (State 5) of the example of Table 3 is depicted in FIG. 35D as 270d, where the TRx1-Ant2 connection is indicated as path 276d, and all other paths are disconnected. A control signal indicated as Vc(s) in FIG. 35D and as listed in Table 3 can be provided to the assembly (272) of the four SPST switches (100a, 100b, 100c, 100d) to effectuate such a switching state.

As one can see, other switching configurations can also be implemented with the DPDT switch of FIGS. 35A-35E. It will also be understood that other switches such as 3P3T of FIGS. 33 and 34 can be controlled by control logic in a similar manner.

Examples of Implementations in Products

Various examples of silicon-on-porous-silicon technologies described herein can be implemented in a number of different ways and at different product levels. Some of such product implementations are described by way of examples.

Packaged Module Implementation

Figure 36A:
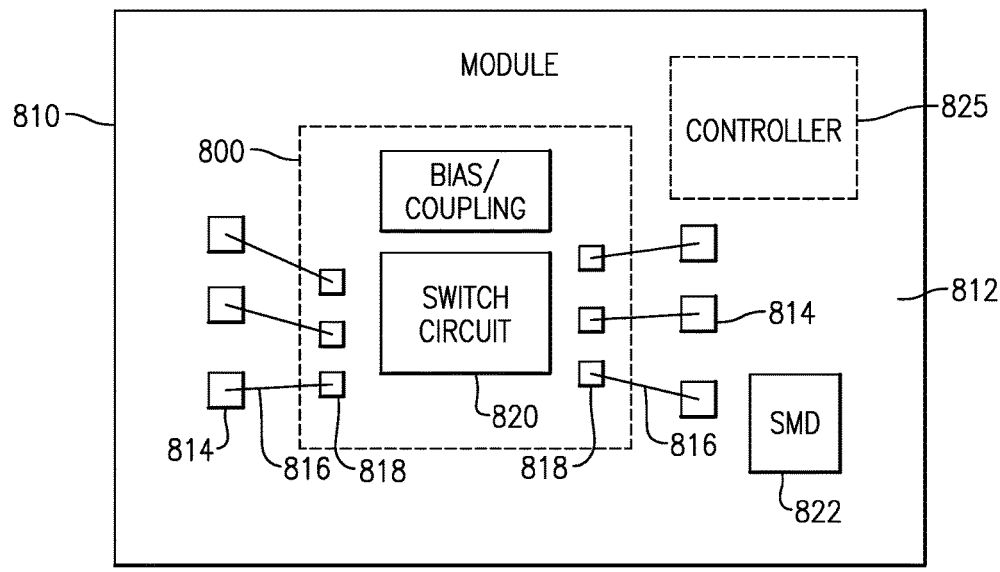
FIGS. 36A and 36B show plan and side views, respectively, of a packaged module having one or more features as described herein.

In some embodiments, one or more die having one or more cavity features described herein can be implemented in a packaged module. An example of such a module is shown in FIGS. 36A (plan view) and 36B (side view). Although described in the context of both of the switch circuit and the bias/coupling circuit being on the same die (e.g., example configuration of FIG. 36A), it will be understood that packaged modules can be based on other configurations. One or more portions of the switch circuit 820 and/or bias/coupling circuitry may be implemented using silicon-on-porous-silicon processes, as described herein.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 120 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 36B:
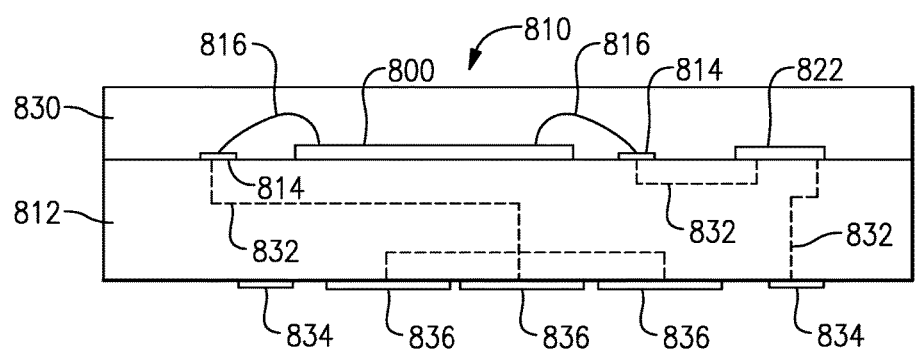
Figure 37:
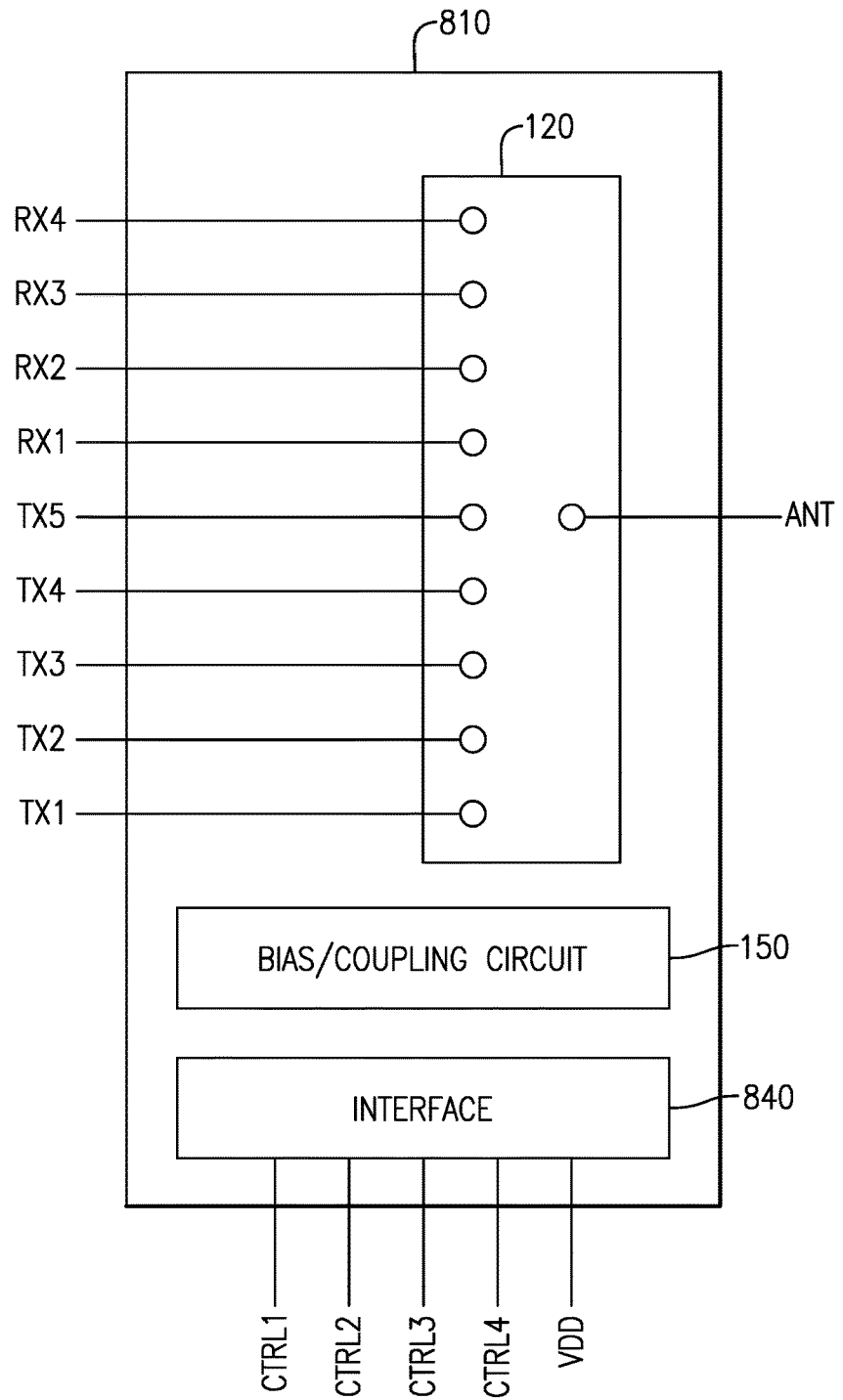
FIG. 37 shows a schematic diagram of an example switching configuration that can be implemented in a module according to one or more embodiments.

FIG. 37 shows a schematic diagram of an example switching configuration that can be implemented in the module 810 described in reference to FIGS. 36A and 36B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 120. In some implementations, supply voltage and control signals can be applied to the switch circuit 120 via the bias/coupling circuit 120.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 38:
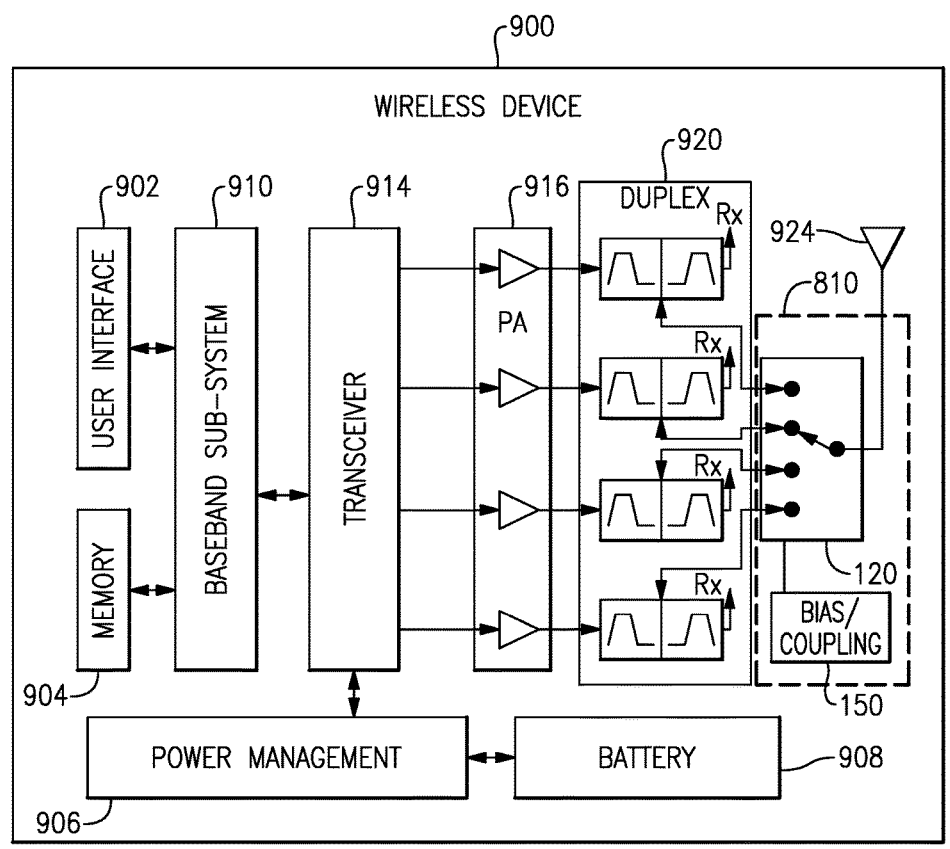
FIG. 38 depicts an example wireless device having one or more advantageous features described herein.

FIG. 38 schematically depicts an example wireless device 900 having one or more advantageous features described herein. In the context of various switches and various biasing/coupling configurations as described herein, a switch 120 and a bias/coupling circuit 120 can be part of a module 810. In some embodiments, such a switch module can facilitate, for example, multi-band multip-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 38, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for fabricating a radio-frequency device, the method comprising:
   providing a field-effect transistor formed over an oxide layer formed on a semiconductor substrate;
   applying a photoresist layer to a backside of the semiconductor substrate;
   patterning the photoresist layer to create an opening; and
   converting at least a portion of the backside of the semiconductor substrate exposed in the opening to porous silicon to create a backside porous silicon portion in the semiconductor substrate, the backside porous silicon portion being positioned at least partially beneath a passive device of the radio-frequency device.

2. The method of claim 1 wherein the backside porous silicon portion in the semiconductor substrate does not laterally overlap with the field-effect transistor.

3. The method of claim 1 wherein the radio-frequency device includes a passive portion and an active portion, the backside porous silicon portion being positioned at least partially underneath the passive portion.

4. The method of claim 1 wherein the backside porous silicon portion at least partially isolates the field-effect transistor from one or more other active devices of the radio-frequency device.

5. The method of claim 1 wherein the radio-frequency device is a silicon-on-insulator device.

6. The method of claim 1 further comprising thinning the semiconductor substrate prior to said converting the at least a portion of the backside of the semiconductor substrate to porous silicon, said thinning the semiconductor substrate exposing the backside of the semiconductor substrate.

7. The method of claim 1 wherein said converting the at least a portion of the backside of the semiconductor substrate to porous silicon is performed using electrochemical etching.

8. A method for fabricating a radio-frequency device, the method comprising:
providing a substrate structure including a silicon handle wafer, an oxide layer formed on a top surface of the silicon handle wafer, and an active silicon layer disposed on the oxide layer;
selectively removing, in a passive area of the substrate structure, a first portion of the oxide layer and a first portion of the active silicon layer to at least partially expose a portion of the top surface of the silicon handle wafer;
converting the exposed portion of the top surface of the silicon handle wafer to porous silicon to form a topside porous silicon portion;
forming a first radio-frequency element using a second portion of the active silicon layer in an active area of the substrate structure; and
forming a second radio-frequency element on the substrate structure, the topside porous silicon portion being disposed at least partially laterally between the first and second radio-frequency elements.

9. The method of claim 8 further comprising forming a passive device on the substrate structure over the topside porous silicon portion.

10. The method of claim 8 further comprising forming a layer of planarizing material on the topside porous silicon portion.

11. The method of claim 10 wherein the planarizing material is silicon oxide.

12. The method of claim 10 further comprising performing chemical-mechanical planarization on the layer of planarizing material.

13. The method of claim 8 wherein said converting the exposed portion of the top surface of the silicon handle wafer to porous silicon is performed using electrochemical etching.

* * * * *